US006441401B1

(12) United States Patent
Jung et al.

(10) Patent No.: US 6,441,401 B1
(45) Date of Patent: Aug. 27, 2002

(54) THIN FILM TRANSISTOR ARRAY PANEL FOR LIQUID CRYSTAL DISPLAY AND METHOD FOR REPAIRING THE SAME

(75) Inventors: Cheol-Soo Jung, Asan; Young-Sun Kim, Cheonan; Ho-Joon Lee, Anyang; Yeong-Hwan Cho; Hyeon-Hwan Kim, both of Cheonan; Bung-Hyuk Min, Cheonan; Woon-Yong Park, Suwon; Il-Gon Kim, Suwon; Jang-Soo Kim, Suwon; Jin-Oh Kwag, Suwon; Seog-Chae Lee, Yongin, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/527,803

(22) Filed: Mar. 17, 2000

(30) Foreign Application Priority Data

Mar. 19, 1999 (KR) .............................................. 99-9421
Dec. 28, 1999 (KR) ............................................ 99-63762

(51) Int. Cl.[7] .............................................. H01L 29/00
(52) U.S. Cl. ............................ 257/72; 257/59; 257/347
(58) Field of Search ............................. 257/59, 72, 347

(56) References Cited

U.S. PATENT DOCUMENTS 5,691,786 A * 11/1997 Nakai
6,271,600 B1 * 8/2001 Inada
6,327,007 B1 * 12/2001 Shim

FOREIGN PATENT DOCUMENTS

JP        37789     7/1992     ............ G09G/3/36
KR       158641     8/1998     ........... G02F/1/136

* cited by examiner

Primary Examiner—Fetsum Abraham
(74) Attorney, Agent, or Firm—McGuireWoods LLP

(57) ABSTRACT

A gate line extending in a horizontal direction is formed on an insulating substrate, and a data line is formed perpendicular to the gate line defining a pixel of a matrix array. Pixel electrodes receiving image signals through the data line are formed in a pixel, and a thin film transistor having a gate electrode connected to the gate line, a source electrode connected to the data line, and a drain electrode connected to the pixel electrode is formed on the portion where the gate lines and the data lines intersect. A storage wire including a storage electrode line in the horizontal direction, a storage electrode connected to the storage electrode line, and at least one of the storage electrode connection portions connecting storage electrodes of neighboring pixels is formed in the same direction as the gate line. A redundant repair line overlaps and is insulated from the storage wire at one end and overlaps the storage wire or the gate wire of a neighboring pixel at the other end is formed in the same layer as the data wire. Also, a storage wire connection portion connecting the storage wires of a neighboring pixel is formed in the same layer as the pixel electrode. In this structure, if portions of the gate wire or the data wire are disconnected, the portions overlapping the disconnected wire, the storage wire, and the redundant repair line are shorted to repair an open wire defect.

20 Claims, 19 Drawing Sheets

THIN FILM TRANSISTOR ARRAY PANEL FOR LIQUID CRYSTAL DISPLAY AND METHOD FOR REPAIRING THE SAME

BACKGROUND OF THE INVENTION (a) Field of the Invention

The present invention relates to a thin film transistor array panel for a liquid crystal display and a method for manufacturing the same. More particularly, the present invention relates to a thin film transistor array panel for a liquid crystal display having wire structures that can repair data line or gate line open and short and a method for manufacturing the same.

(b) Description of the Related Art

Liquid crystal displays (LCDs) are one of the most widely used flat panel display (FPD) configurations. The liquid crystal display has two panels having electrodes for generating an electric field and a liquid crystal layer interposed between the two panels. The transmittance of incident light is controlled by the intensity of the electric field applied to the liquid crystal layer.

In the most widely used liquid crystal displays, field-generating electrodes are respectively formed on both of the panels, and one of the panels has switching elements such as thin film transistors.

A typical liquid crystal display uses a thin film transistor as a switching element. Data lines and gate lines, which cross each other and define pixels in a matrix array, are formed on the panel on which the thin film transistors are disposed. Further, a pixel electrode, which receives an image signal from the data lines through the thin film transistor and generates an electric field with a common electrode, is formed in each pixel.

In the thin film transistor array panel for a liquid crystal display, a storage electrode line is formed overlapping the pixel electrode via an insulating layer and provides storage capacitance along with the pixel electrode to improve the capacitance of a liquid crystal capacitor.

On the other hand, in the thin film transistor array panel for a liquid crystal display having a panel with pixel electrodes and common electrodes at the same panel and generating an electric field parallel to the panel, a common electrode line connected to the common electrodes and transmitting a common voltage works as a storage electrode line.

However, in manufacturing a thin film transistor array panel for a liquid crystal display, the gate lines and the data lines respectively connecting the output terminals of a integrated drive circuit to source and gate terminals of the thin film transistor tend to be damaged by open/short defects. These open/short defects are the main reasons that reduce the yields. Furthermore, costs to repair the open/short defect are expensive.

SUMMARY OF THE INVENTION

It is an object of the present invention to provide a thin film transistor panels for LCDs having a wire structure such that repairs of wire open/short defects are easy.

It is another object of the present invention to provide wire repair methods for easily repairing gate and data line open/short defects in an LCD manufacturing process.

These and other objects are provided, according to the present invention, by forming a redundant repair line one end of which overlaps the storage wire, and the other end of which overlaps the storage wire or the gate wire of a neighboring pixel column, and the redundant repair line is insulated from and overlaps the common electrode wire at one end and overlaps the gate wire or the storage wire of a neighboring pixel at the other end.

According to the present invention, a gate wire, including a plurality of gate lines formed in a certain direction, and a storage wire, including storage electrode lines formed in the same direction as the gate line, storage electrodes connected to the storage electrode lines and at least one of storage electrode connection portions connecting the storage electrodes of neighboring pixels, are formed. A data wire, including data lines formed in a direction approximately perpendicular to the gate wire and that are insulated from and intersecting the gate wire and the storage wire, is also formed. A redundant repair line that is insulated from and overlaps the storage wire at one end and overlaps the storage wire or the gate wire of neighboring pixel at the other end, is formed as well. A pixel electrode, formed in a pixel having a matrix array defined by the intersection of the gate lines and the data lines, forms a storage capacitor by overlapping the storage wire, and receives image signals through the data line.

Here, storage wire connection portions connecting the storage wires of neighboring pixel may be added.

At this time, the redundant repair lines may be formed by the same layer as the data wire. The storage wire connection portions may be formed by the same layer as the pixel electrode and the storage wires may be formed by the same layer as the gate wire.

In another embodiment according to the present invention, a plurality of gate lines including gate electrodes in a certain direction is formed on an insulating substrate. A common electrode line is formed between two neighboring gate lines. A plurality of common electrodes electrically connected to the common electrode line is formed in a direction approximately perpendicular to the gate lines in a unit pixel. Additionally, a plurality of data wires in a direction approximately perpendicular to the gate lines and intersecting the gate lines are also formed. Furthermore, semiconductor layers on and insulated from the gate lines are formed, a plurality of source electrodes connected to the data line and extended on the semiconductor layers are formed as well, and a plurality of drain electrodes extended on the semiconductor layers opposite to the source electrodes and separated from the source electrodes are also formed. A plurality of pixel electrodes electrically connected to the drain electrodes and in parallel with the common electrodes are formed alternately with the common electrodes, and a redundant repair line simultaneously overlapping the common electrode lines and the gate lines is formed.

In a thin film transistor panel for liquid crystal display according to the present invention, if open/short defects of the gate lines or the data lines occur, the portions of the redundant repair line overlapping the gate wire, the data wire, the storage wire, or the common wire are shorted to repair the open/short defects.

BRIEF DESCRIPTION OF THE DRAWINGS

The accompanying drawings, which are incorporated in and constitute a part of the specification, illustrate an embodiment of the invention, and, together with the description, serve to explain the principle of the invention.

DETAILED DESCRIPTION OF THE PREFERRED EMBODIMENTS

Figure 1:
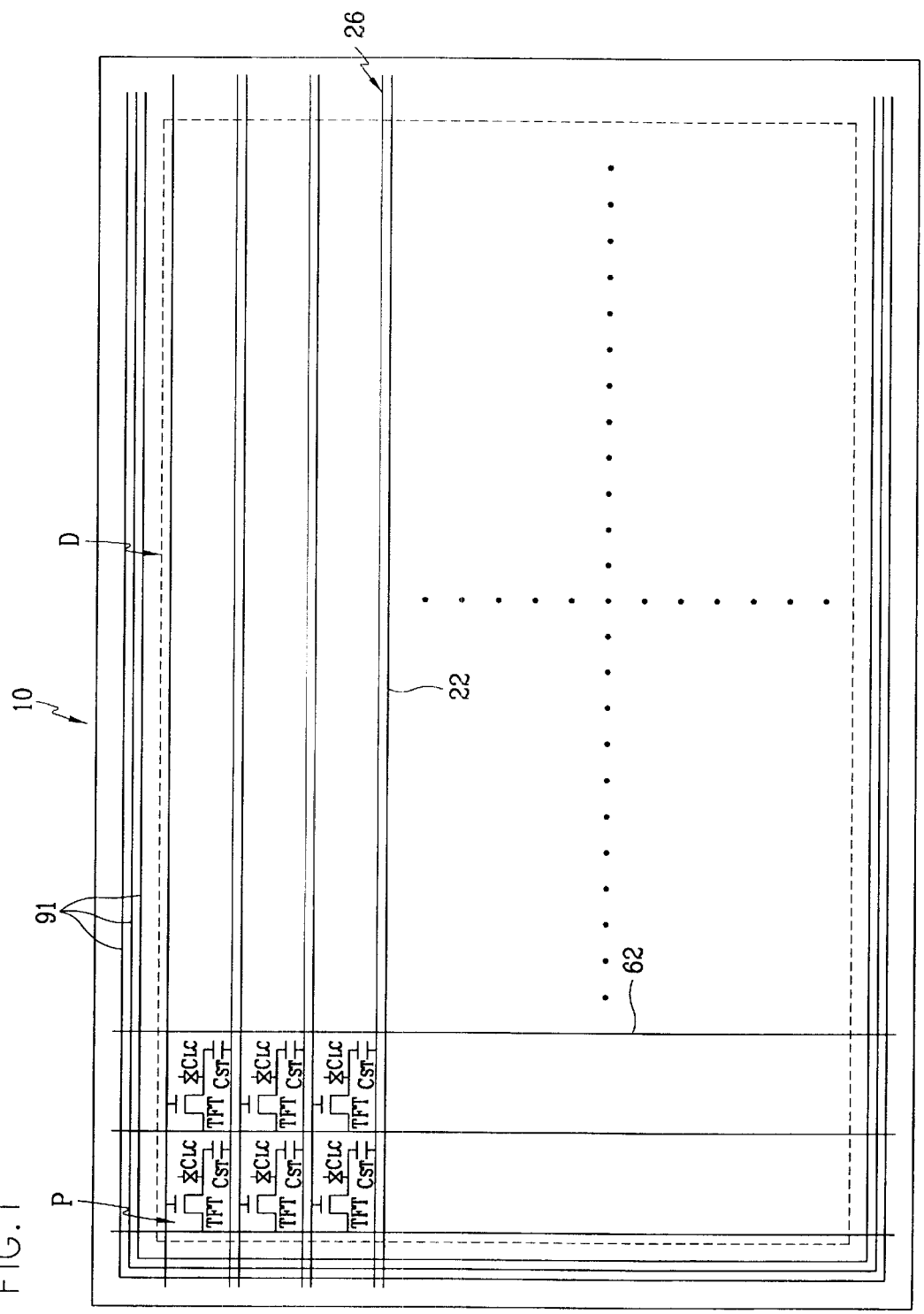
FIG. 1 is a plane view of a thin film transistor array panel for a liquid crystal display according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

FIG. 1 is a plane view of a thin film transistor array panel for a liquid crystal display according to an embodiment of the present invention.

As shown in FIG. 1, in a thin film transistor array panel for a liquid crystal display according to an embodiment of the present invention, a plurality of gate lines 22 transmitting a scanning signal and a plurality of data lines 62 transmitting a display signal or an image signal cross each other. A plurality of pixels P defined by the gate lines 22 and the data lines 62 includes a thin film transistor TFT, a liquid crystal capacitor $C_{LC}$ and a storage capacitor $C_{ST}$. A gate and a source of the thin film transistor TFT are connected to the gate line 22 and the data line 62, respectively, and a drain of the thin film transistor TFT is connected to the one terminal of the liquid crystal capacitor $C_{LC}$ and to the first terminal of the storage capacitor $C_{ST}$. The second terminal of the storage capacitor $C_{ST}$ is connected to a storage electrode line 26 parallel to the gate line 22. Here, a reference number D indicates an active region displaying an image and consisting of a group of the pixels P in a matrix. A plurality of repair ring lines 91 intersecting the gate lines 22 and the data lines 62 are formed about the perimeter of the active region D.

A unit pixel of the thin film transistor array panel according to the embodiment of the present invention will now be described in detail with reference to FIGS. 2 and 3.

Figure 2:
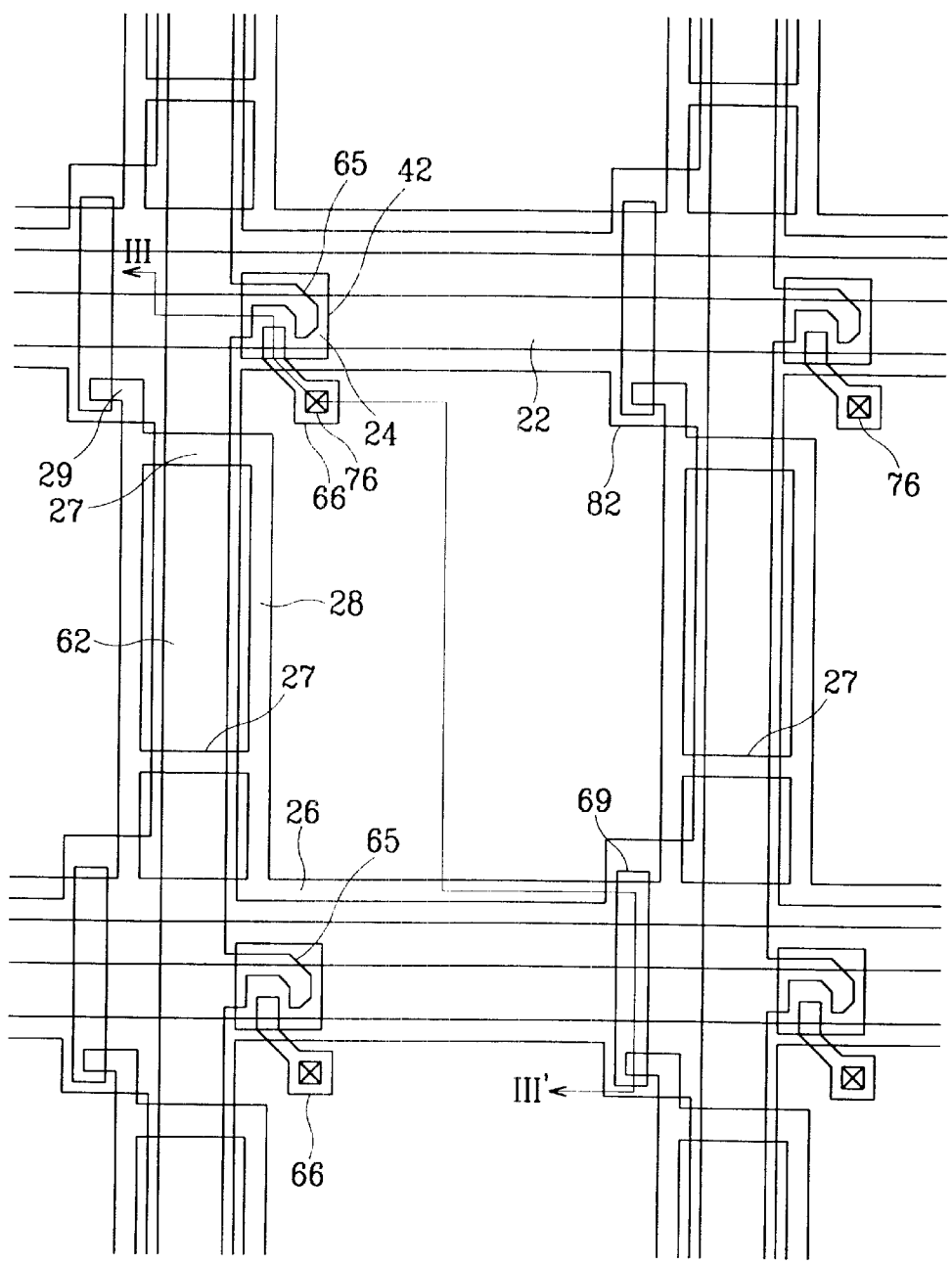
FIG. 2 is a layout view of a thin film transistor array panel for a liquid crystal display according to a first embodiment of the present invention.
Figure 3:
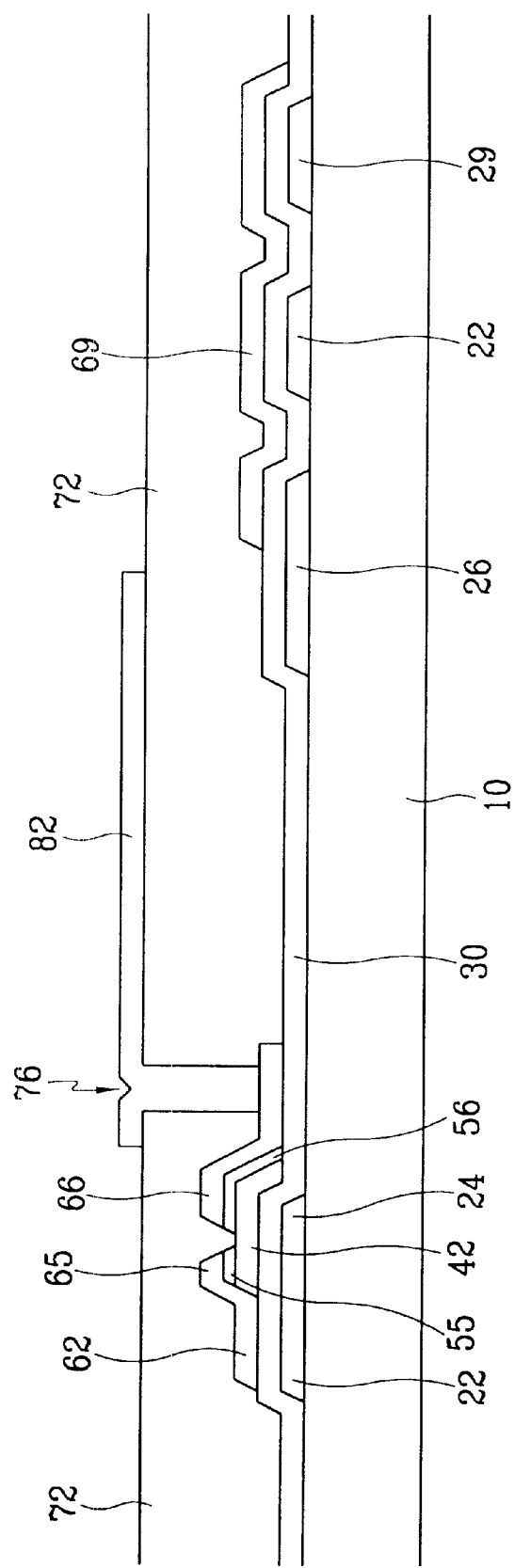
FIG. 3 is a cross-sectional view taken along line III–III' of FIG. 2.

FIG. 2 is a layout view of a thin film transistor array panel for a liquid crystal display according to a first embodiment of the present invention and FIG. 3 is a cross-sectional view taken along line III–III' of FIG. 2.

As shown in FIGS. 2 and 3, gate wires and storage wires of metal or conductive material such as aluminum (Al) or aluminum alloy, molybdenum (Mo) or molybdenum-tungsten (MoW), chromium (Cr), and tantalum (Ta) are formed on an insulating substrate 10. A gate wire includes a gate line (or scanning signal line) 22 extending in the horizontal direction in FIG. 1 and transmitting a scanning signal and a gate electrode 24 which is a part of the gate line and one terminal of a thin film transistor. The gate wire may include a gate pad connected to an end of the gate line 22 and transmitting a scanning signal from an external circuit to the gate line 22. A storage wire includes a storage electrode line 26 formed parallel to the gate line 22. It is provided with a voltage such as a common voltage applied to a common electrode (not shown) on an upper panel of the liquid crystal display. The storage wire also includes a storage electrode 28 extending in the vertical direction in FIG. 1, a storage electrode connection portion 27 connecting the storage wire of neighboring pixel row, and a wire repair portion 29 connected to an end of the storage electrode 28. The storage wires 26, 27, 28, and 29 of a neighboring pixel row are connected at three places including the two storage electrode connection portions 27 and the storage electrode line 26, but may also be connected to the storage electrode connection portions 27 and the storage electrode line 26. The storage wires 26, 27, 28, and 29 form a storage capacitor ($C_{ST}$ in FIG. 1) to provide storage capacitance along with a pixel electrode 82 which will be described later. Here, common voltage applied to the storage wire 26, 27, 28, and 29 may be input through one pad along one direction of the storage electrode line 26, or through a plurality of pads using both directions of the storage electrode line 26.

The gate wire parts 22 and 24, and storage wire parts 26, 27, 28, and 29 may have a multiple-layered structure as well as a single-layered structure. When the gate wire parts 22 and 24, and storage wire parts 26, 27, 28, and 29 are formed of multiple layers, it is preferable that one layer is made of a material having a low resistivity and another layer is made of a material having good contacting properties with other materials, particularly ITO (indium tin oxide) for the pixel electrode. It is because the wire and the ITO used for the pixel electrode are used together to reinforce the pad portions electrically connected to the exterior.

A gate insulating layer 30 of silicon-nitride (SiNx) is formed on gate wire parts 22 and 24, and storage wire parts 26, 27, 28, and 29 and covers the same.

A semiconductor pattern 42 (made of a semiconductor such as hydrogenated amorphous silicon) is formed on the gate insulating layer 30. Ohmic contact layer patterns 55 and 56 (made of such materials as amorphous silicon heavily doped with impurities like phosphorus) are formed on the semiconductor pattern 42.

Source and drain electrodes 65 and 66, made of conductive materials such as Mo or MoW, Cr, Al or Al alloy, and Ta, are formed on the ohmic contact layer patterns 55 and 56. A data line 62 extending in the vertical direction on FIG. 2, connected to the source electrode 65, and defining a pixel along with gate line 22 is formed on the gate insulating layer 30. The data wire parts 62, 65, and 66 may include a data pad connected to an end of data line 62. The data pad transmits image signals from an external circuit to the data line 62. Also, a redundant repair line 69 intersecting the gate line 22 of neighboring pixel column is formed in the vertical direction of FIG. 2 on the gate insulating layer 30 with the same layer as the data wire parts 62, 65, and 66. One end of the redundant repair line 69 overlaps the storage wire 26, and the other end of the redundant repair line 69 overlaps the wire repairing portion 29 of neighboring pixel column. The other end of the redundant repair line 69 may be extended to the gate line 22 of a neighboring pixel column.

The data wire parts 62, 65, and 66, and the redundant repair line 69 may have a multiple-layered structure like the gate wire parts 22 and 24. Of course, when the data wire has a multiple-layered structure, it is preferable that one layer is made of a material having a low resistivity and another is made of a material having good contacting properties with other materials.

A passivation layer 72 is formed on the data wire parts 62, 65, and 66, and the semiconductor layer 42, which is not covered by the data wire parts 62, 65, and 66. The passivation layer 72 has a contact hole 76 exposing the drain electrode 66. The passivation layer 72 can be made of an insulating material such as SiNx, acrylic organic material, other transparent photo-definable material, or other organic material.

The pixel electrode 82 that receives an image signal and generates an electric field with a common electrode of an upper panel is formed on the passivation layer 72. The pixel electrode 82 is made of a transparent conductive material such as indium tin oxide (ITO). Here, a storage wire connection portion connecting the neighboring storage wires 26, 27, 28, and 29 through the contact hole of the passivation layer 72 and the gate insulating layer 30 may be formed with the same layer as the pixel electrode 82, and will be described in detail with reference to the drawings.

In this structure according to the present invention, the redundant repair line 69 of the same layer as the data wire 62, 65, and 66 may be formed with the same layer as the pixel electrode 82 on the passivation layer 72, and the storage wire connection portion may be formed with the same layer as the redundant repair lines 69 on the gate insulating layer 30. On the other hand, the passivation layer 72 may have contact holes respectively exposing the gate pad and the data pad. Hence, a redundant gate pad and a redundant data pad respectively connected to the gate pad and the data pad through the contact holes may be formed on the gate pad and the data pad with the same layer as the pixel electrode 82.

A method for repairing open/short defects of the gate wire, the data wire, or the storage wire in a thin film transistor array panel according to an embodiment of the present invention will now be described in detail.

Figure 4A:
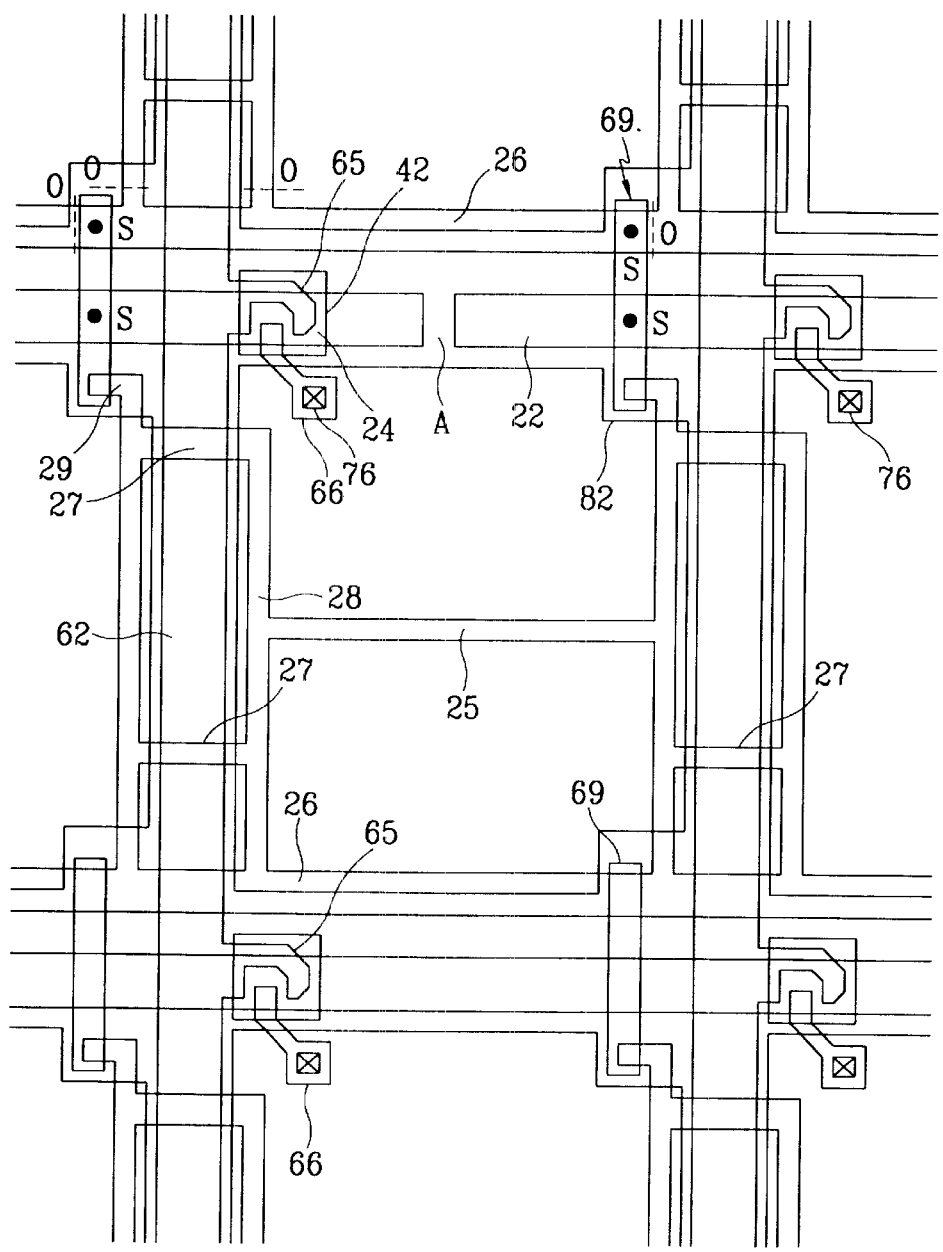
FIG. 4A is a layout view showing a method for repairing an open of a gate line in a thin film transistor array panel for a liquid crystal display according to the first embodiment of the present invention.

FIG. 4A is a layout view showing a method for repairing an open of a gate line in a thin film transistor array panel for a liquid crystal display according to the first embodiment of the present invention.

As shown in FIG. 4A, if the gate line 22 is severed at portion A, the S portions (•) overlapping a redundant repair line 69, the gate line 22 and the storage electrode line 26 on both sides of portion A are shorted using a laser. Accordingly, scanning signals transmitted to the severed gate line 22 are re-routed through the redundant repair line 69 and the storage electrode line 26. At this time, the O portions (represented by dashed lines) of the storage electrode line 26 that are outside of both sides of the S portions got open to prevent scanning signals from being transmitted to all of the storage wires 26, 27, 28, and 29. Here, the storage electrode 28 between the O portions may also be severed, and signals, such as common voltage, that can be applied to the storage electrode line 26 are transmitted along both directions of the storage electrode line 26. On the other hand, if the signals are transmitted from only one direction of the storage electrode line 26, a storage redundant line 25 connecting the storage electrode 28 may be added as indicated in FIG. 4A.

Figure 4B:
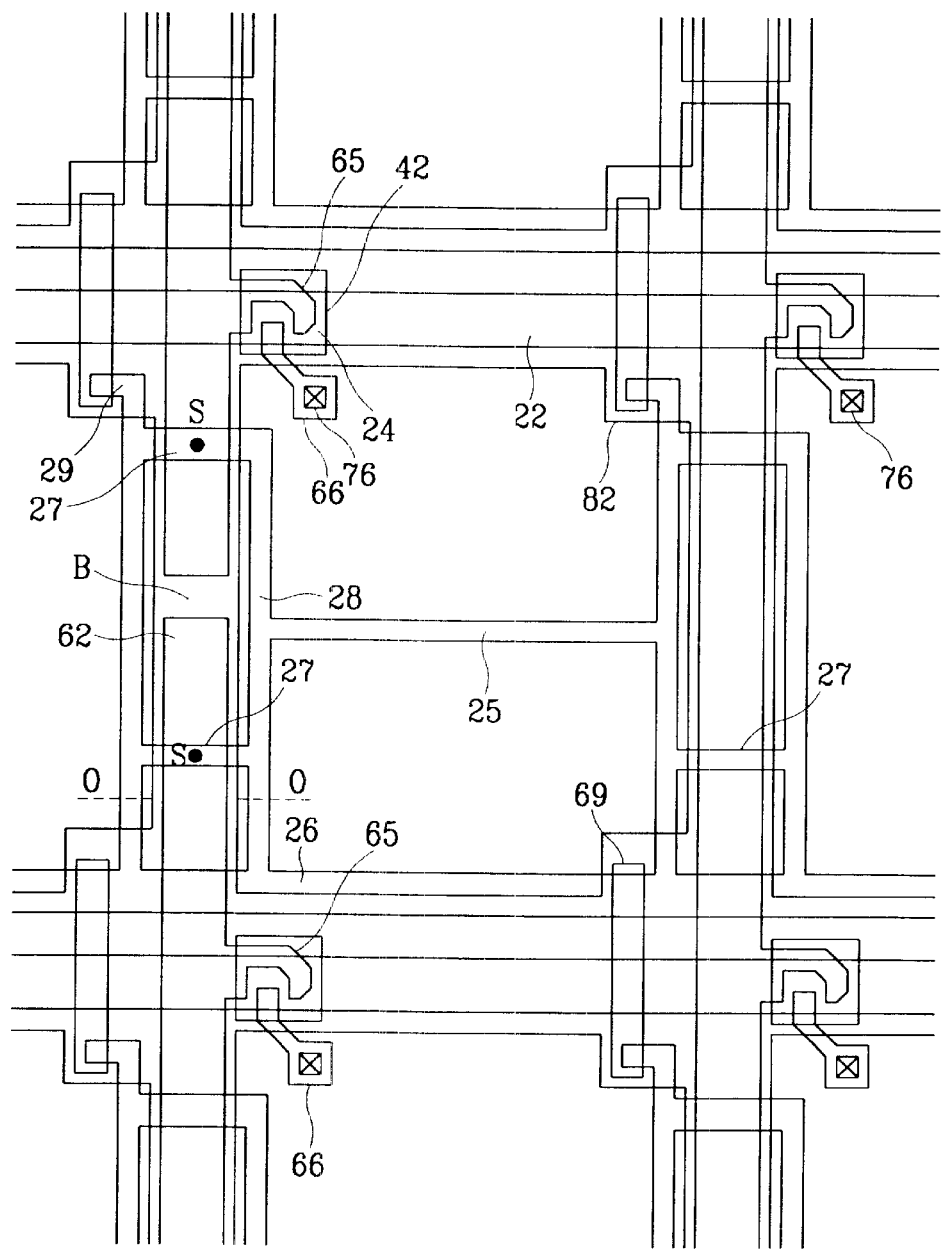
FIG. 4B is a layout view showing a method for repairing an open of a data line in a thin film transistor array panel for a liquid crystal display according to the first embodiment of the present invention.

FIG. 4B is a layout view showing a method for repairing an open of a data line in a thin film transistor array panel for a liquid crystal display according to the first embodiment of the present invention.

As shown in FIG. 4B, if the data line 62 is severed in portion B, the S portions (•) overlapping the storage wires 26 and 27, and the data line 62 on the upper/lower sides of portion B are shorted using a laser. Accordingly, image signals transmitted to the severed data line 62 are re-routed through the storage wires 26 and 27. Here, only the storage electrode line 26 and the storage electrode connection portion 27 can be used. However, when each pixel unit is formed with two storage electrode connection portions connecting the storage electrode 28 of the neighboring pixel, both of the two storage electrode connection portions can be used to repair the severed data line 62. At this time, the O portions (represented by dashed lines) of the storage electrode line 26 neighboring the S portions got open to prevent image signals from being transmitted to all of the storage wires 26, 27, 28, and 29. Here, if two storage electrode connection portions 27 are used to repair the severed data line 62, then signals applied to the storage electrode line 26 can be transmitted from one direction of the storage electrode line 26. On the other hand, if the storage electrode line 26 is used to repair the severed data line 62, it is preferable that signals applied to the storage electrode line 26 be transmitted from both directions of the storage electrode line 26.

Figure 4C:
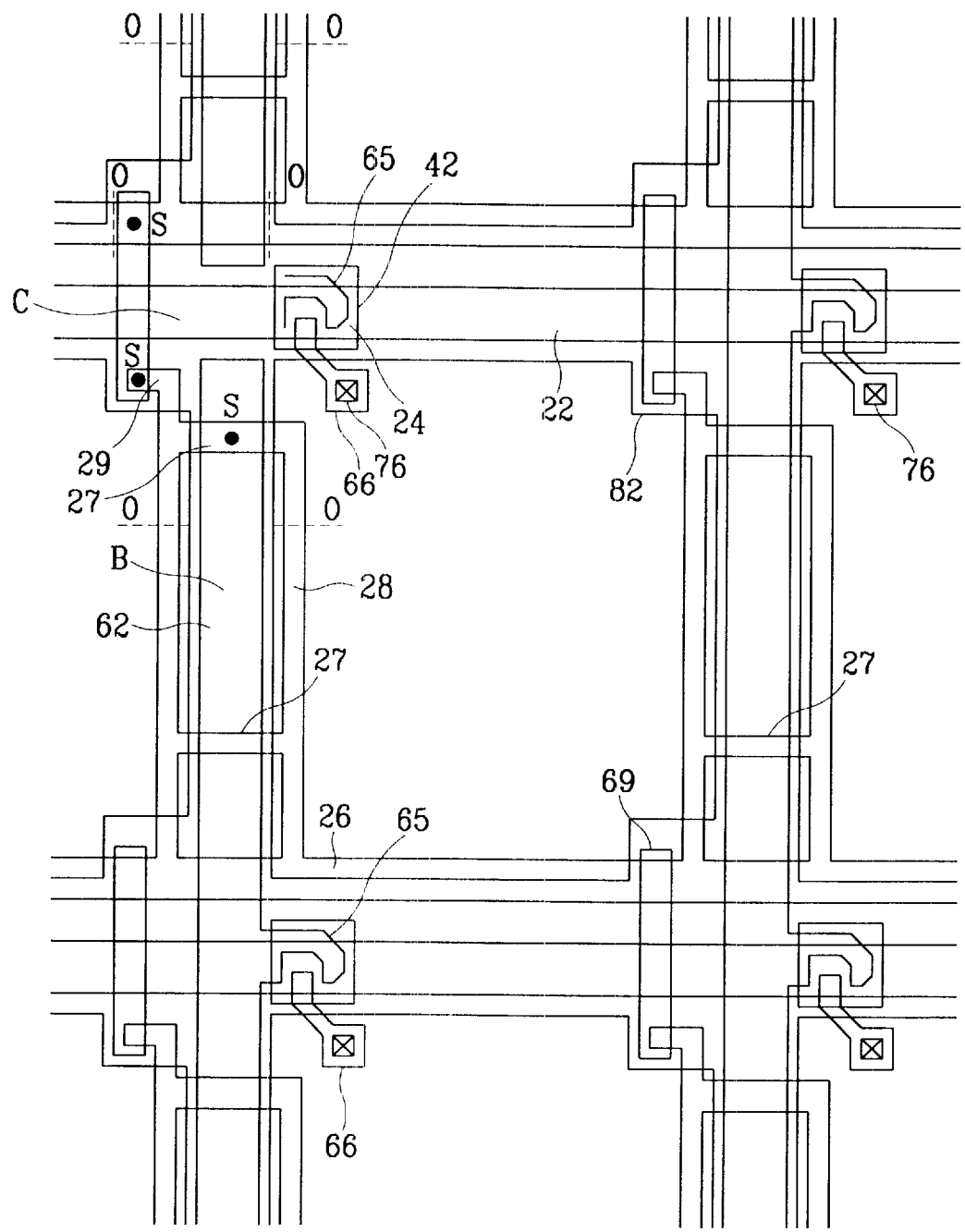
FIG. 4C is a layout view showing a method for repairing an open between a source electrode and a data line in a thin film transistor array panel for a liquid crystal display according to the first embodiment of the present invention.

FIG. 4C is a layout view showing a method for repairing an open between a source electrode and a data line in a thin film transistor array panel for a liquid crystal display according to the first embodiment of the present invention.

As shown in FIG. 4C, if the source electrode 65 is severed from the data line 62 in portion C, the S portions (•) overlapping the storage electrode connection portions 27 and the data line 62 neighboring the portion C, and the S portions (•) overlapping the storage wires 26 and 29, the redundant repair line 69, and the data line 62 neighboring the portion C are shorted using a laser. Accordingly, image signals transmitted to the severed data line 62 are re-routed through the storage wires 26, 27, 28, and 29, and the redundant repair line 69. At this time, the O portions (represented by dashed lines) of the storage electrode line 26 and 28 neighboring the S portions got open to prevent image signals from being transmitted to all of the storage wires 26, 27, 28, and 29. Here, signals applied to the storage electrode line 26 may be transmitted from both directions of the storage electrode line 26.

A the thin film transistor array panel having a storage wire connection portion according to the embodiment of the present invention will now be described in detail.

Figure 5:
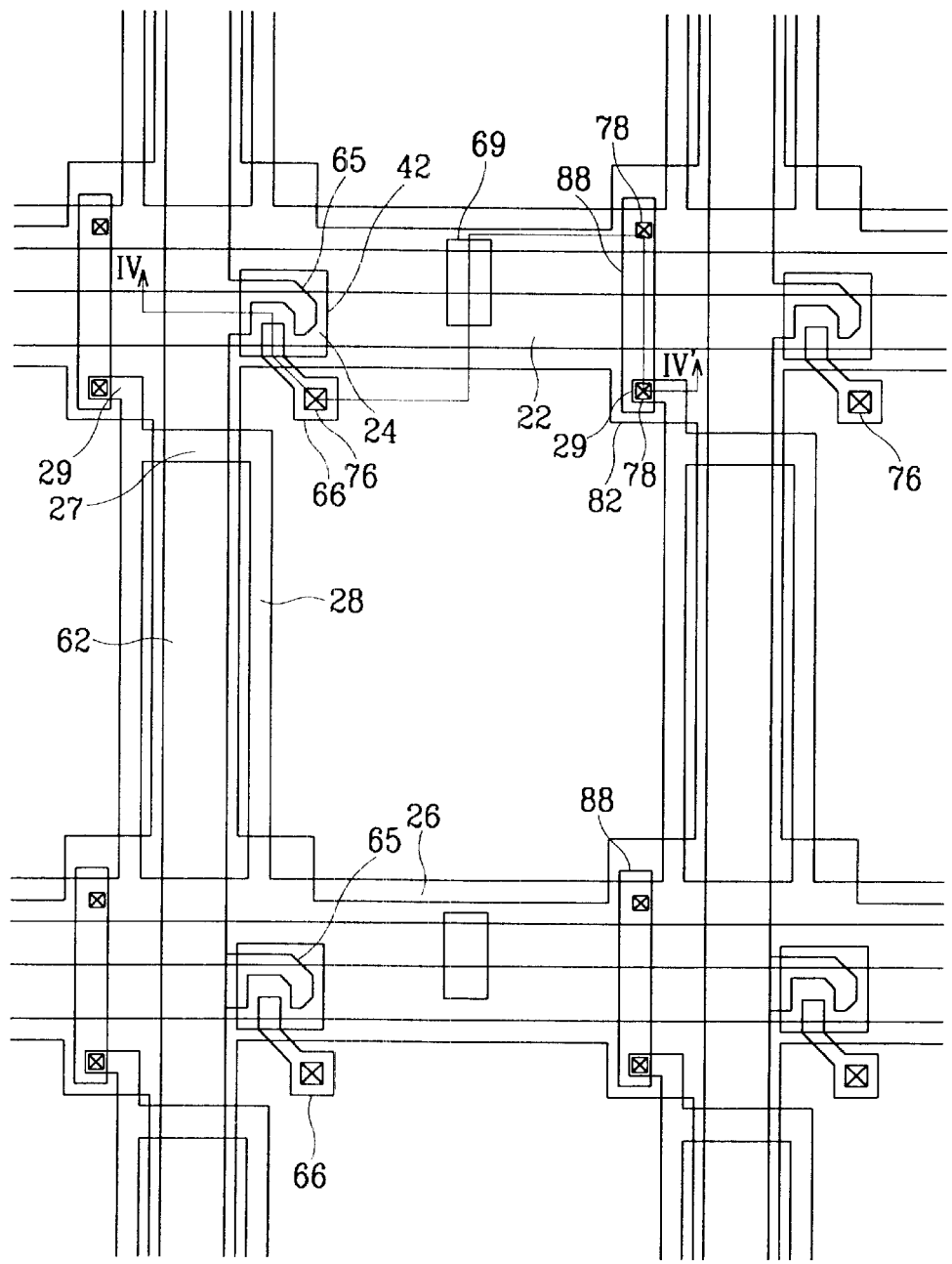
FIG. 5 is a layout view of a thin film transistor array panel for a liquid crystal display according to a second embodiment of the present invention.
Figure 6:
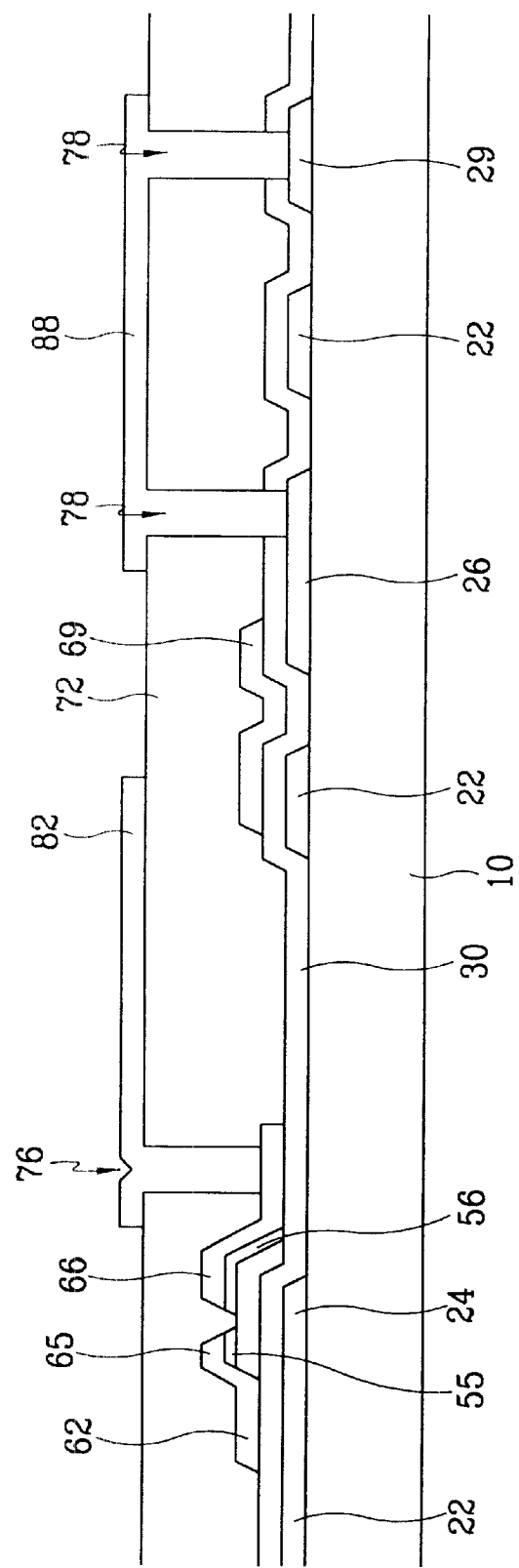
FIG. 6 is a cross-sectional view taken along line VI–VI' of FIG. 5.

FIG. 5 is a layout view of a thin film transistor array panel for a liquid crystal display according to a second embodiment of the present invention, and FIG. 6 is a cross-sectional view taken along line VI–VI' of FIG. 5.

As shown in FIGS. 5 and 6, the greater part of the structure is similar to that of the first embodiment.

However, both ends of a redundant repair line 69 respectively overlap a storage electrode line 26 and a gate line 22 of a neighboring pixel. Also, a gate insulating layer 30 and a passivation layer 72 have contact holes 78 exposing storage wires 26 and 29, and a plurality of storage wire connection portions 88 connecting the neighboring storage wires 26, 27, 28, and 29 of a pixel column through the contact holes 78 are formed with the same layer as a pixel electrode 82.

In the thin film transistor panel for a liquid crystal display according to the second embodiment, because the neighboring storage wires 26, 27, 28, and 29 are connected to each other, the distortions of signals applied to the neighboring storage wires 26, 27, 28, and 29 may be minimized. Also, the thin film transistor panel according to the second embodiment may have one pad that receives signals applied to the storage wires 26, 27, 28, and 29 from the outside.

Figure 7A:
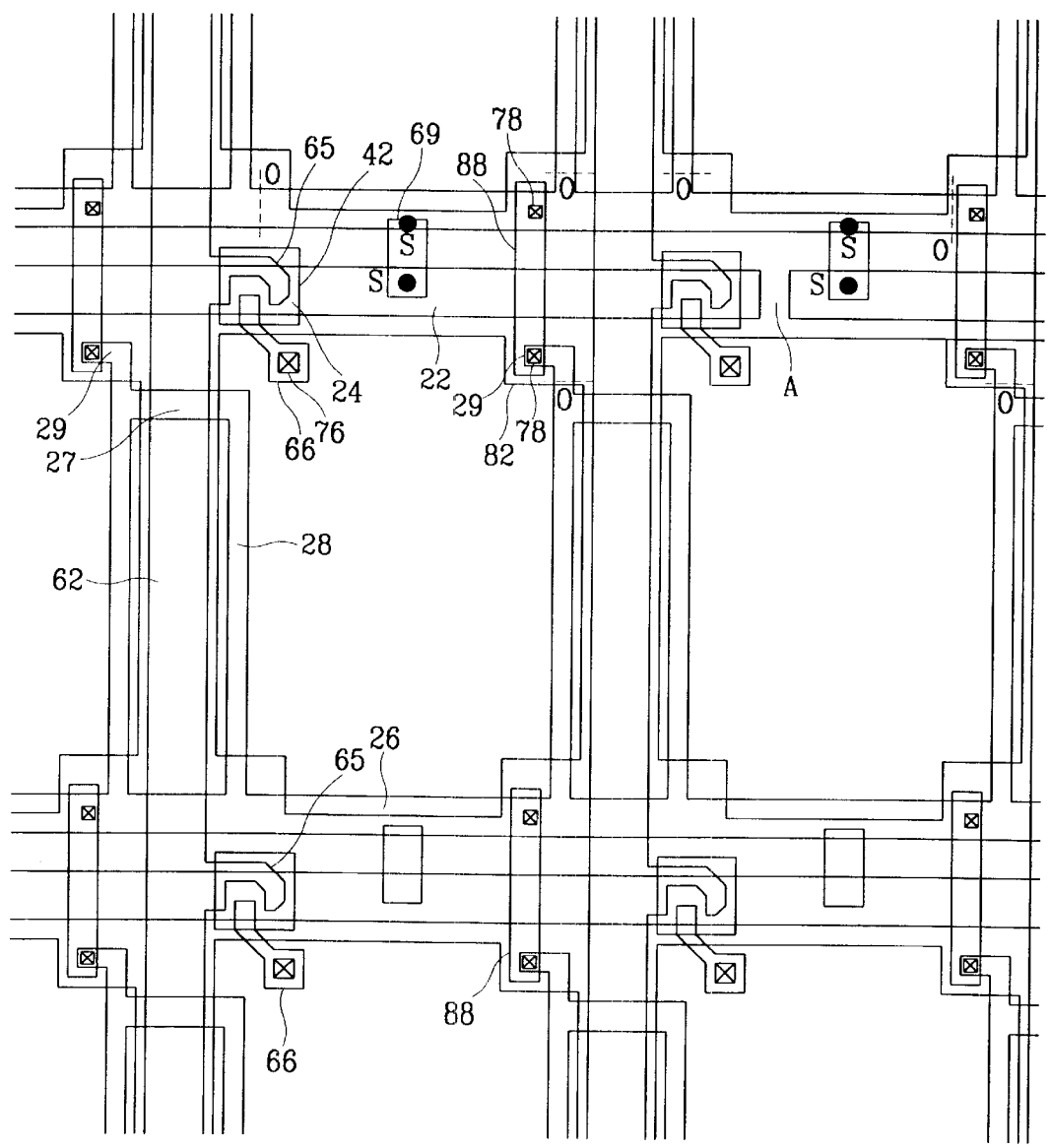
FIG. 7A is a layout view showing a method for repairing an open of a gate line in a thin film transistor array panel for a liquid crystal display according to the second embodiment of the present invention.

FIG. 7A is a layout view showing a method for repairing an open of a gate line in a thin film transistor array panel for a liquid crystal display according to the second embodiment of the present invention.

As shown in FIG. 7A, if the gate line 22 is severed in portion A, the S portions (•) overlapping the redundant repair line 69, the gate line 22 and the storage electrode line 26 on both sides of portion A are shorted using a laser. Accordingly, scanning signals transmitted to the severed gate line 22 are re-routed through the redundant repair line 69 and the storage electrode line 26. At this time, the O portions (represented by dashed lines) of the storage electrode line 26, 28, and 29 neighboring the S portions got open to prevent scanning signals from being transmitted to all of the storage wires 26, 27, 28, and 29. Here, because all of the storage wires 26, 27, 28, and 29 are connected to each other through the storage wire connection portion 88, the O portions of the storage electrode 28 between the S portions must be severed to divide the storage electrode 28 from the rest of the storage line 28.

Figure 7B:
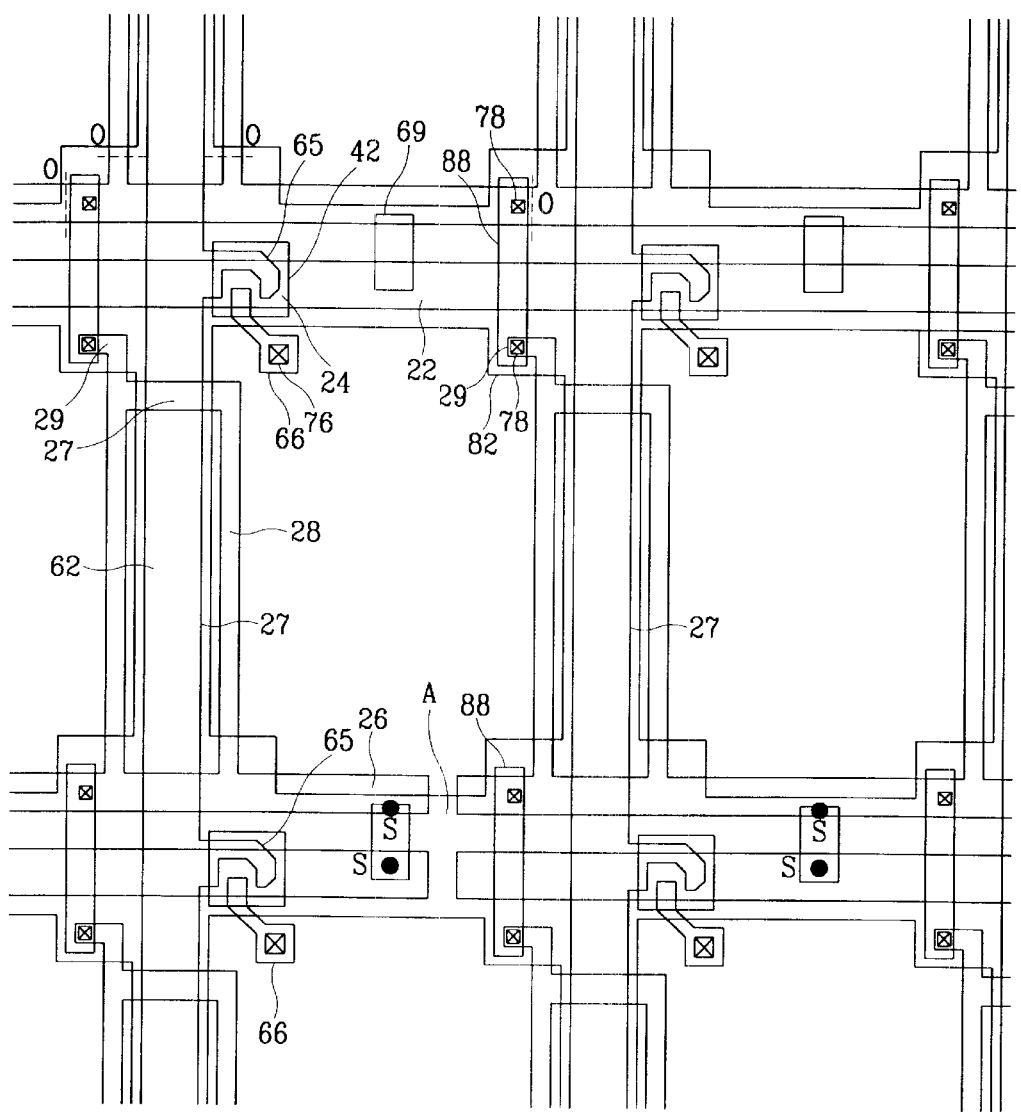
FIG. 7B is a layout view showing a method for repairing an open of a data line in a thin film transistor array panel for a liquid crystal display according to the second embodiment of the present invention.

FIG. 7B is a layout view showing a method for repairing an open of a data line in a thin film transistor array panel for a liquid crystal display according to the second embodiment of the present invention.

As shown in FIG. 7B, if the data line 62 is severed in portion B, the S portions (•) overlapping the storage wires 26 and 27, and the data line 62 on the upper/lower sides of portion B are shorted using a laser. Accordingly, image signals transmitted to the severed data line 62 are re-routed through the storage wires 26 and 27. At this time, the O portions (represented by dashed lines) of the storage electrode line 26 and the storage electrode 28 neighboring the S portions got open to prevent image signals from being transmitted to all of the storage wires 26, 27, 28, and 29.

Figure 7C:
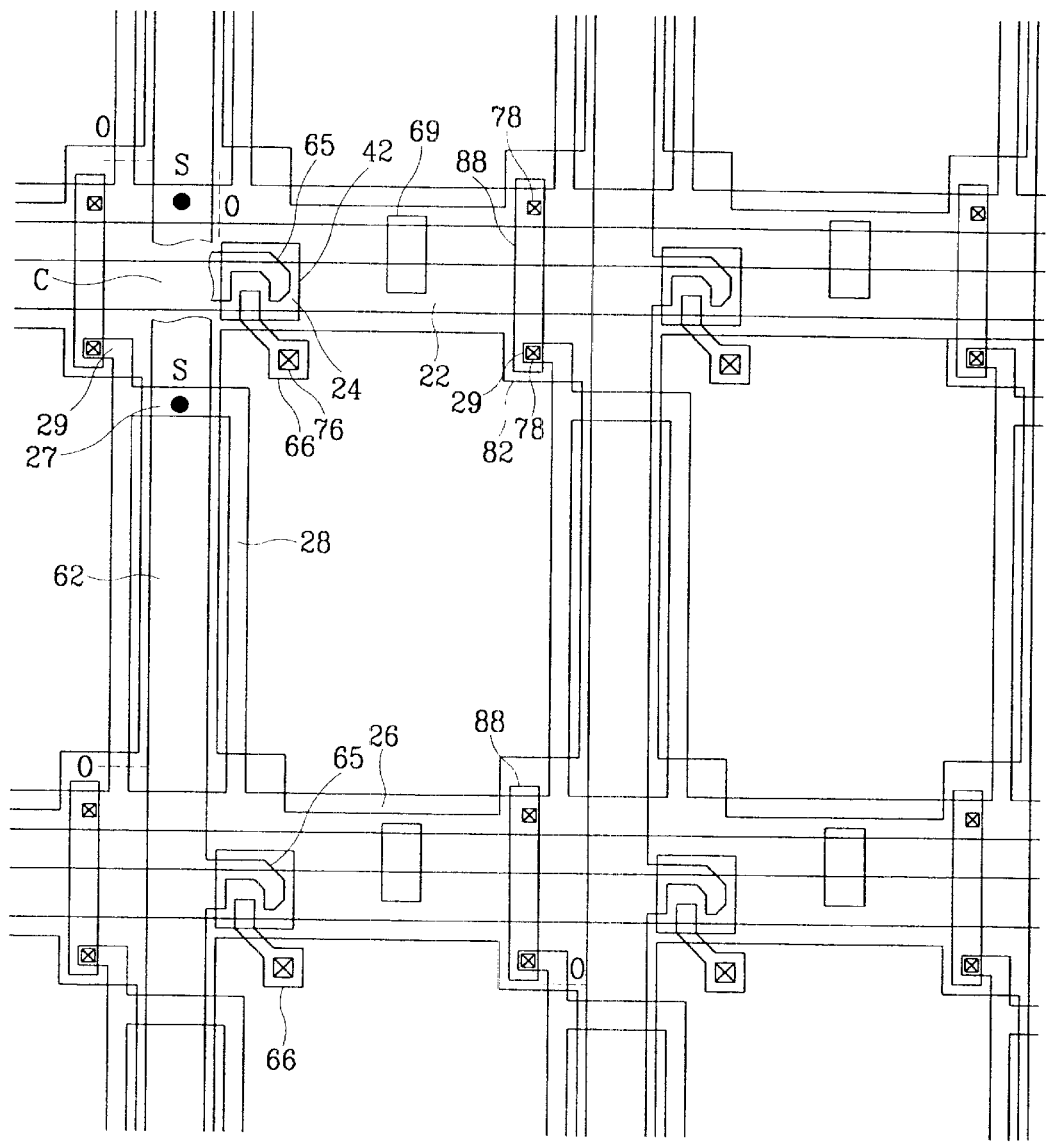
FIG. 7C is a layout view showing a method for repairing an open between a source electrode and a data line in a thin film transistor array panel for a liquid crystal display according to the second embodiment of the present invention.

FIG. 7C is a layout view showing a method for repairing an open between a source electrode and a data line in a thin film transistor array panel for a liquid crystal display according to the second embodiment of the present invention.

As shown in FIG. 7C, if the source electrode 65 is severed from the data line 62 in portion C, the S portions (e) overlapping the storage electrode connection portions 27, the storage electrode line 26, and the data line 62 neighboring the portion C are shorted using a laser. Accordingly, image signals transmitted to the severed data line 62 are re-routed through the storage wires 26, 27, and 29, and the storage wire connection portion 88. At this time, the 0 portions (represented by dashed lines) of the storage wires 26 and 28 neighboring the S portions got open to prevent image signals from being transmitted to all of the storage wires 26, 27, 28 and 29.

In these embodiments, transparent ITO is taken as an example of the material of the pixel electrode 82, but an opaque-conductive material may also be used in a reflective type liquid crystal display.

Next, a method for repairing a thin film transistor panel for a liquid crystal display whose pixel electrodes and common electrodes are formed in a single substrate and whose liquid crystal molecules are controlled by an electric field nearly parallel to the substrate will be described in detail with reference to drawings.

First, the structure of the thin film transistor panels for a liquid crystal display according to the third embodiment will be described.

Figure 8:
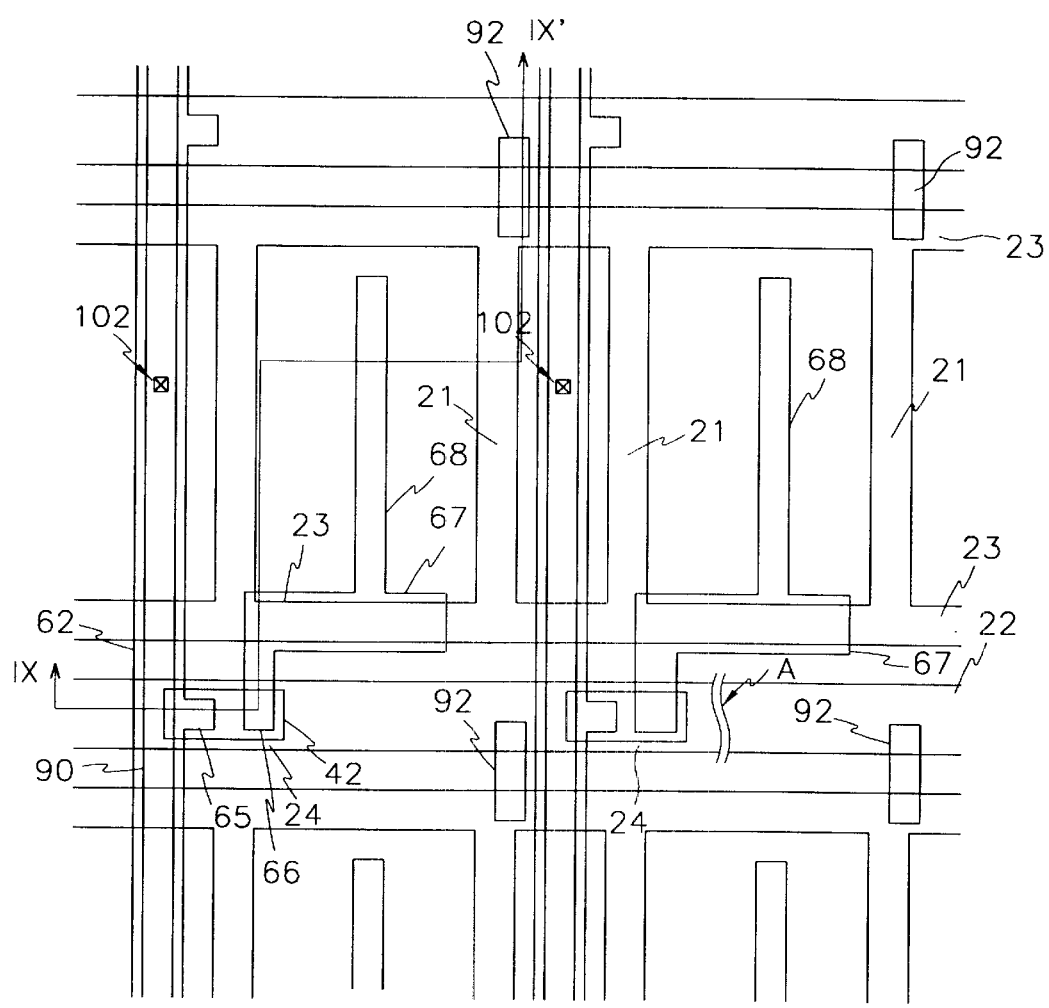
FIG. 8 is a layout view of a thin film transistor array panel for a liquid crystal display according to a third embodiment of the present invention.
Figure 9:
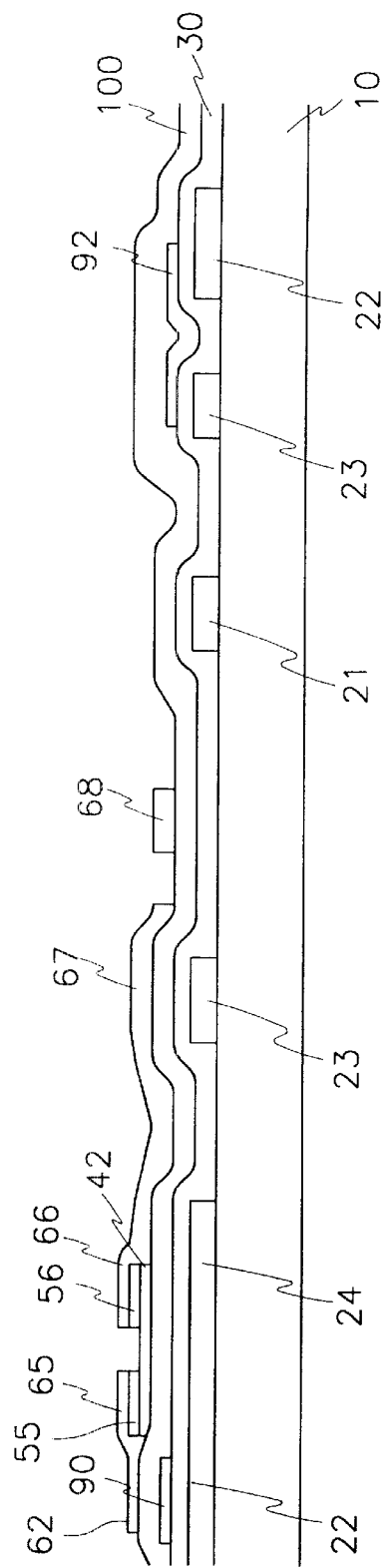
FIG. 9 is a cross-sectional view taken along line IX–IX' of FIG. 8.

FIG. 8 is a layout view of a thin film transistor array panel for a liquid crystal display according to a third embodiment of the present invention, and FIG. 9 is a cross-sectional view taken along line IX–IX' of FIG. 8.

As shown in FIGS. 8 and 9, a gate line (scanning signal line) 22, and a gate electrode 24 are formed on an insulating substrate 10, dual common lines 23 parallel to the gate lines 22 are formed between the two gate lines 22, and a plurality of common electrodes 21 connecting the dual common electrode lines 23 are formed in the horizontal direction in FIG. 8.

A gate insulating layer pattern 30 of silicon-nitride (SiNx) is formed on the gate wires 22 and 24, the common electrode line 23, and the common electrode 21.

A plurality of redundant data lines 90 extending in the vertical direction in FIG. 8 and defining unit pixel along with the gate lines 22 are formed on the gate insulating layer 30. The each unit pixel includes at least two common electrodes 21, and the common electrodes 21 located at the outer area of unit pixel are adjacent to the redundant data line 90. Also, a plurality of redundant repair lines 92 overlapping the gate line 22, and one or two of the common electrode lines 23 neighboring the gate lines 22 are formed on the gate insulating layer 30. The redundant repair lines 92 are formed one by one in a unit pixel, and are made of the same material as the redundant data lines 90.

The redundant data line 90, and the redundant repair lines 92 are covered by an interlayer insulating layer 100.

A semiconductor layer 42, a data line 62, a source electrode 65, a drain electrode 66, a pixel electrode line 67, and a pixel electrode 68 are formed on the interlayer insulating layer 100. The semiconductor layer 42 is located on the gate electrode 24. The data line 62, extending in the vertical direction in FIG. 8 and connected to the redundant data line 90 through a contact hole 102 of the interlayer insulating layer 100, is located on the redundant data line 90. A source electrode 65 overlaps a portion of the semiconductor layer 42. A drain electrode 66 located opposite to the source electrode 65 with respect to the gate electrode 24 and separated from the source electrode 65 overlaps a portion of the semiconductor layer 42. Ohmic contact layers 55 and 56 are formed between the source electrode 65 and the drain electrode 66 and the semiconductor layer 42 in order to improve the contact characteristics between them. A pixel electrode line 67 is extended in the horizontal direction in FIG. 8 from the drain electrode 66, and overlaps the common electrode line 23 to form a storage capacitor between them. A pixel electrode 68 is extended in the vertical direction in FIG. 8, and is alternately located along with the common electrodes 21 to apply electric fields that are nearly parallel to the substrate 10.

As described above, in the thin film transistor panel for the liquid crystal display according to the third embodiment, the redundant repair lines 92 simultaneously overlap the gate lines 22 and the common electrode lines 23 with the gate insulating layer 30 interposed therebetween. It may be formed of the same layer as the data line 62.

These redundant repair lines 92 are used to repair opens of the gate lines 22 and the data lines 62, as well as shorts between them.

Figure 10:
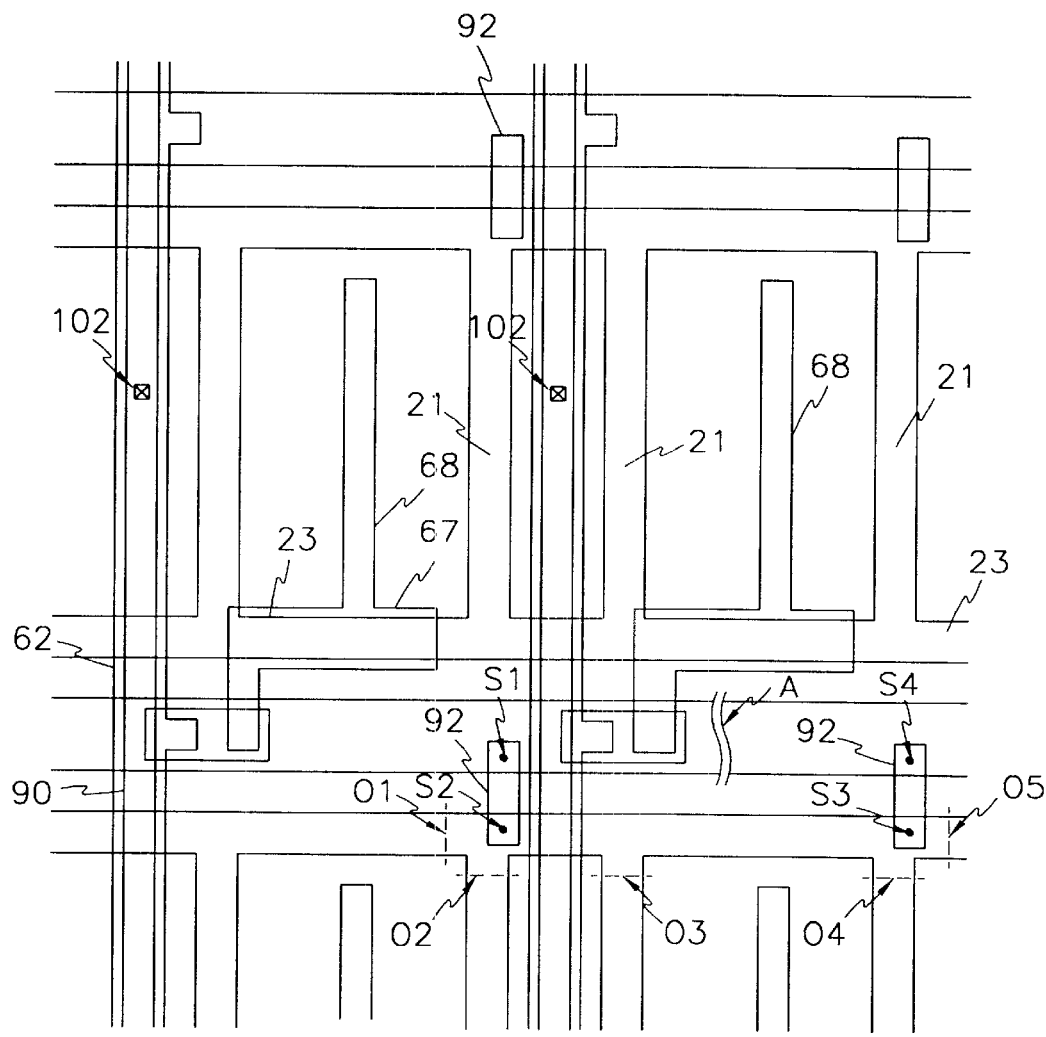
FIG. 10 is a layout view showing a method for repairing an open of a gate line in a thin film transistor array panel for a liquid crystal display according to the third embodiment of the present invention.

FIG. 10 is a layout view showing a method for repairing an open of a gate line in a thin film transistor array panel for a liquid crystal display according to the third embodiment of the present invention.

As shown in FIG. 10, if the gate line 22 is severed in portion A, the gate line 22, the common electrode line 23, and the S1, S2, S3, and S4 portions overlapping the redundant repair lines 92 located on both sides of the portion A are shorted using a laser. Next, the O1 and O5 portions of the common electrode line 23 on the respective left and the right sides of the S2 and S3 portions are disconnected, and O2, O3, and O4 portions of the common electrodes 21 connected to the common electrode line 23 between the two O1 and O5 portions are disconnected in order to separate the common electrodes 21 from the common electrode line 23.

Accordingly, by isolating the portion of the common electrode line 23 and shorting the isolated portion of the common electrode line 23, the severed gate line 22, and the redundant repair line 92, scanning signals transmitted to the severed gate line 22 are re-routed through the redundant repair line 92 and the common electrode line 23. At this time, because one of the dual common electrode lines 23 is used, the common voltage is transmitted through the other of the dual common electrode lines 23 that is not used to repair the severed gate line 22.

Next, a method for repairing short between the gate line 22 and the data line 62 is described with reference to FIG. 11.

Figure 11:
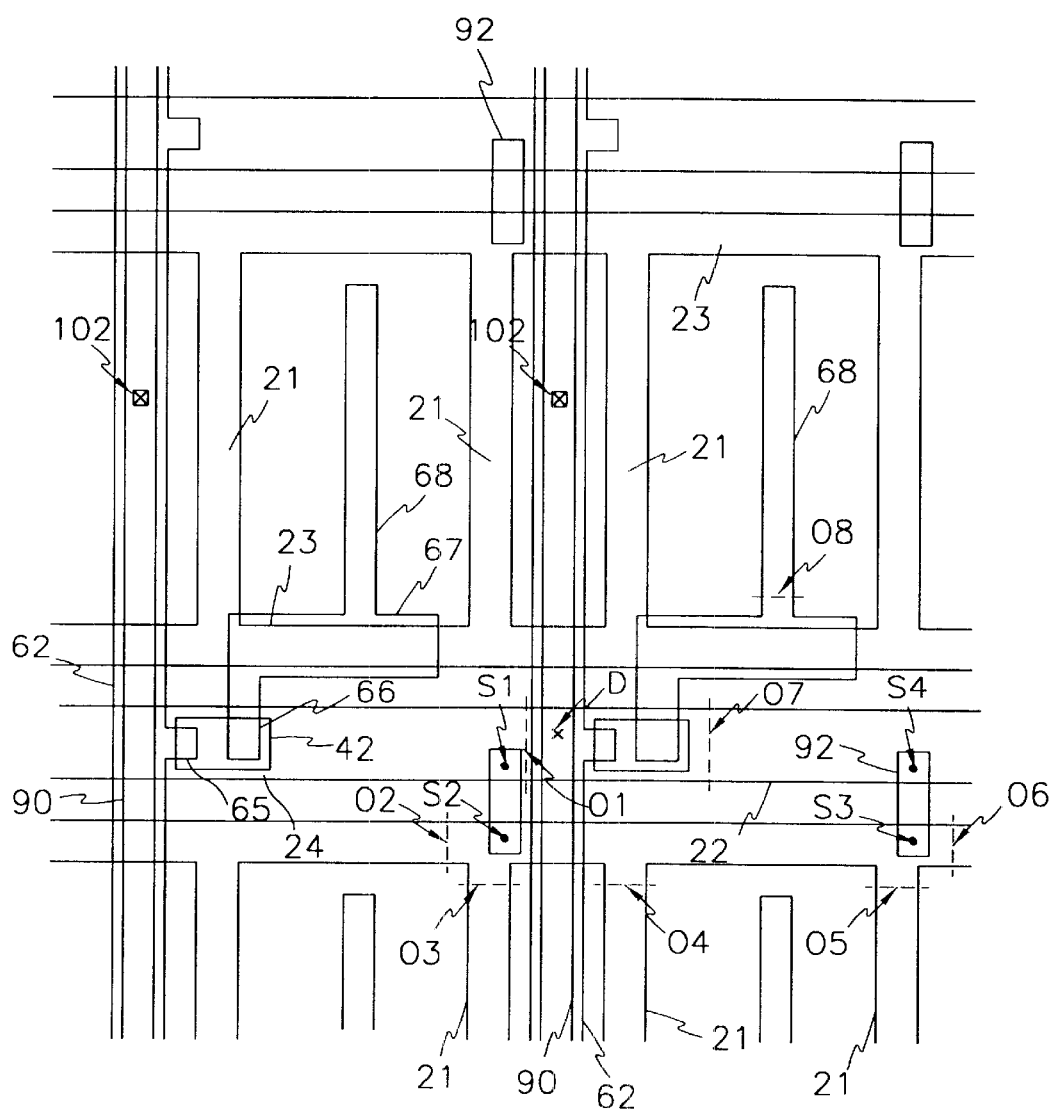
FIG. 11 is a layout view showing a method for repairing a short between a data line and a gate line in a thin film transistor array panel for a liquid crystal display according to the third embodiment of the present invention.

FIG. 11 is a layout view showing a method for repairing a short between a gate line and a data line in a thin film transistor array panel for a liquid crystal display according to the third embodiment of the present invention.

As shown in FIG. 11, if the portion overlapping the gate line 22, and the data line 62 or the redundant data line 92 is shorted at the D portion (x), the S1, S2, S3 and S4 portions (•) overlapping the redundant repair lines 92 located at both sides of the portion D, and the gate line 22 and the common electrode line 23 can be shorted using a laser with a method similar to the above described method for repairing the severed gate line 22. At this time, the O2 and O6 portions of the common electrode line 23, which are respectively located at the left and right sides of the left and right redundant repair lines 92 in FIG. 11, and the O3, O4, and O5 portion of the common electrodes 21, connected to the common electrode line 23 between the O2 and O6 portions, are opened. Then, two O7 portions of the gate line 22 between the shorted data line 62 and the two redundant repair lines 92 are cut to prevent an image signal of the shorted data line 62 from being transmitted to the gate line 22. The O8 portion is also cut on the pixel electrode 68 that connects the pixel electrode line 67 in the corresponding pixel.

In this way, by isolating the portion of the common electrode line 23, shorting the isolated portion of the common electrode line 23, and the shorted gate line 22 using the redundant repair line 92, and disconnecting the shorted gate line 22 between the shorted data line 62 and the redundant repair line 92, an image signal transmitted to the shorted data line 62 is transmitted without an interference from the scanning signals, and scanning signals transmitted to the shorted gate line 22 are re-routed around the shorted portion D through the S1, S2, S3 and S4 portions.

Figure 12:
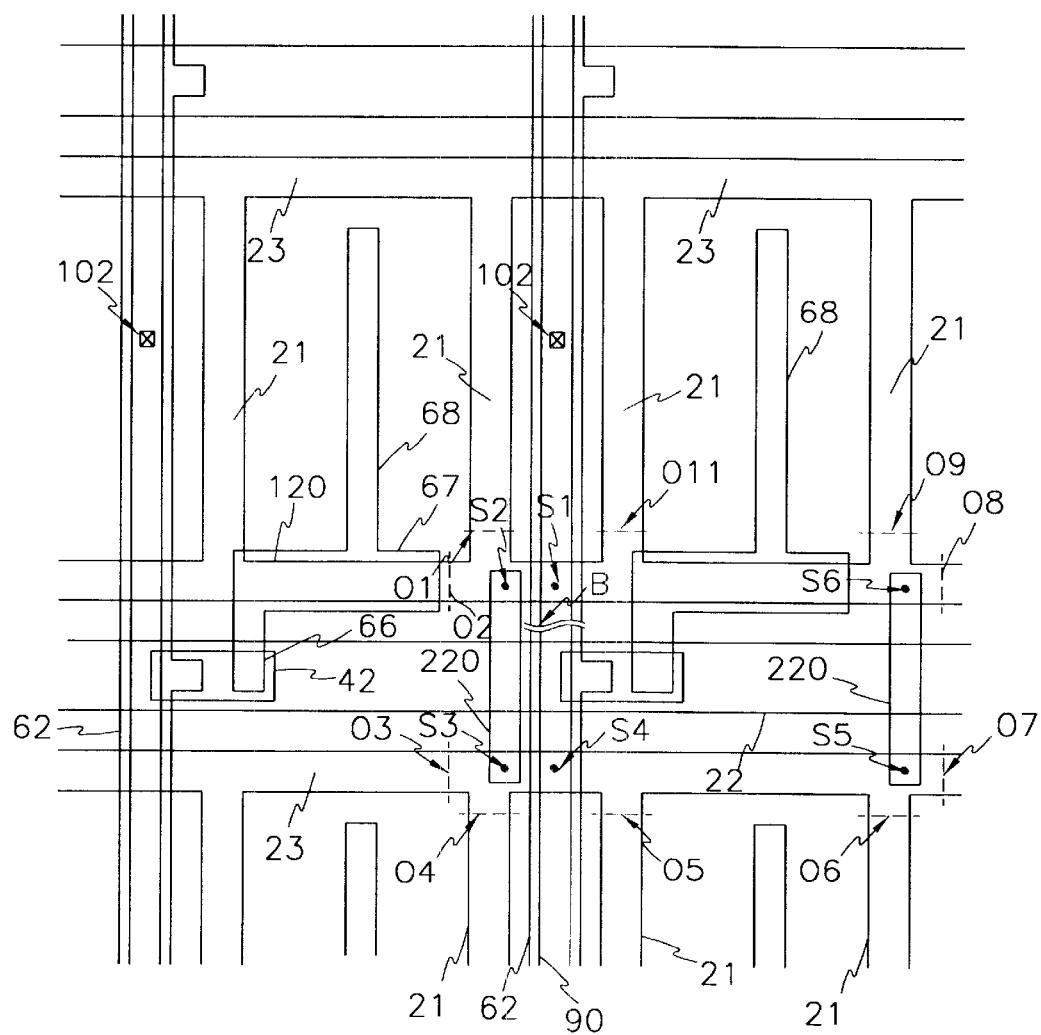
FIG. 12 is a layout view showing a first method for repairing an open defect of a data line in a thin film transistor array panel for a liquid crystal display according to the fourth embodiment of the present invention.
Figure 13:
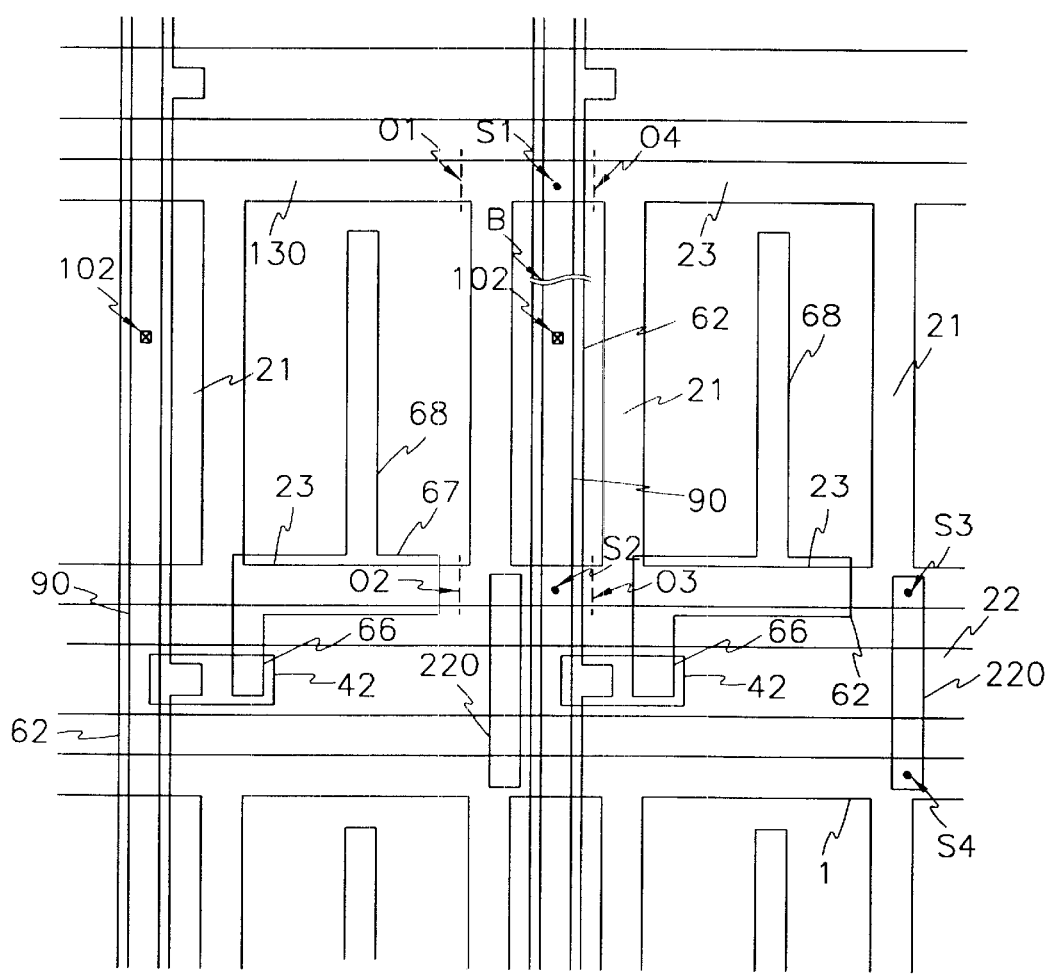
FIG. 13 is a layout view showing a second method for repairing an open defect of a data line in a thin film transistor array panel for a liquid crystal display according to the fourth embodiment of the present invention.

As shown in FIGS. 12 and 13, a change in the structure of the redundant repair line according to the third embodiment of the present invention may repair the open defects of the data line more easily.

FIG. 12 is a layout view showing a first method for repairing an open defect of a data line in a thin film transistor array panel for a liquid crystal display according to the fourth embodiment of the present invention.

As shown in FIG. 12, the redundant repair line 220 overlaps the two common electrode lines 23 neighboring the upper and lower sides of the gate line 22. If the portion B of the data line 62 between the two common electrode lines 23 overlapped by the redundant repair line 220 is severed, then the S1 and S2 portions overlapping the data line 62 and the common electrode lines 23 at the upper and lower sides of the opened portion B of the data line 62, and the S3, S4, S5, and S6 portions lying on top of the common electrode line 23 and the redundant repair lines 220 located in FIG. 12 at the left and the right sides of the portion B are shorted using a laser. Next, the O2 and O3 portions on the common electrode line 23 at left side in FIG. 12 of the redundant repair line 220 located at left side of the opened portion B, and the O7 and O8 portions on the common electrode line 23 at right side in FIG. 12 of the redundant repair line 220 located at right side of the opened portion B are disconnected. The O1, O4, O5, O6, O9 and O11 portions of the common electrodes 21 connected to the common lines 23 and neighboring the common electrode line 23 are disconnected.

In this way, by shorting the data wires 62 and 90 and the common electrode line 23 at the upper and lower sides of the disconnected portion B, and by shorting the isolated common electrode line 23 and the redundant repair line 92, an image signal transmitted to the disconnected data line 62 is re-routed through the S1, S2, S3, S4, S5, and S6 portions and is passed by the common electrode lines 23 and the redundant repair lines 220 in order to transmit an image signal to the lower side of the disconnected data line 62.

FIG. 13 is a layout view showing a second method for repairing an open defect of a data line in a thin film transistor array panel for a liquid crystal display according to the fourth embodiment of the present invention.

As shown in FIG. 13, if the portion B of the data line 62 or the redundant data line 90 between the two common electrodes 21 of two neighboring pixels is severed, the S1 and S2 (•) portions, overlapping the data line 62 and the redundant data line 90 as well as the common electrode lines 23 at the upper and lower sides of the opened portion B of the data line 62, are shorted using a laser. Additionally, the O1, O2, O3, and O4 portions of the two common electrode lines 23 located at the left and the right sides in FIG. 13 of the shorted S1 and S2 portions are disconnected.

When disconnecting the common electrode lines 23, it is desirable to disconnect the common electrode line 23 at point O3 and O4 that are closest to the data line 62. It is because such a cut would preserve the most of the common electrode in the neighboring pixel. Also, to transmit common voltages to the common electrode line 23 and the common electrodes 21 to the right side of the disconnected portion B in FIG. 13, the S3 and S4 portions overlapping the redundant repair lines 220 and the common electrode line 23 are shorted.

In this way, by shorting the data wires 62 and 90 and the common electrode line 23 at the upper and lower sides of the disconnected portion B, and forming the path transmitting an image signal by using the common electrode lines 23 or the common electrode 21, the image signal transmitted to the disconnected data line 62 is transmitted to the data line 62 under the lower portion of the disconnected portion B.

Next, the fifth embodiment according to the present invention to improve operational yields by minimizing the number of disconnects using a laser when repairing will be described with reference to FIGS. 14 and 15.

Figure 14:
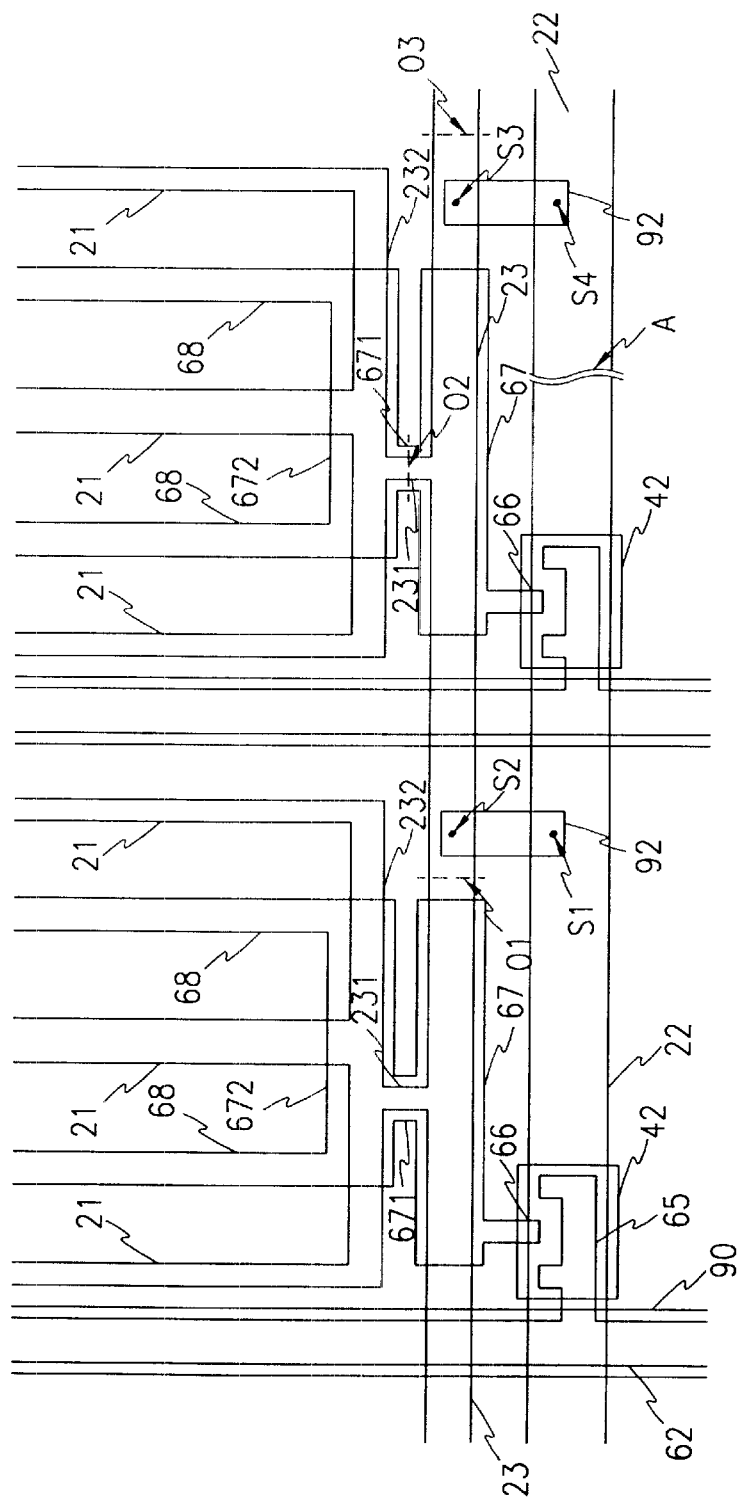
FIG. 14 is a layout view showing a method for repairing an open of a gate line in a thin film transistor array panel for a liquid crystal display according to the fifth embodiment of the present invention.

FIG. 14 is a layout view showing a method for repairing an open of a gate line in a thin film transistor array panel for a liquid crystal display according to the fifth embodiment of the present invention.

As shown in FIG. 14, in the film transistor panel according to the fifth embodiment of the present invention, a gate line 22, a redundant data line 90, a source electrode 65, a data line 62, a semiconductor layer 42, and a drain electrode 66 are formed as described in the embodiments above. However, the structures of the common wire and the pixel wire are different from that of the third and the fourth embodiments.

Dual common electrode lines 23 parallel to the gate line 22 are formed as in the above embodiments, a first connection portion 231 is extended from the common electrode 23, and a sub common electrode line 232 is connected to the first connection portion 231. Also, a plurality of common electrodes 21 are extended approximately perpendicularly from the sub common electrode line 232.

A pixel electrode line 67 extended from a drain electrode 66 overlaps the common electrode line 23 as in the above embodiments, and a second connection portion 671 extended from the pixel electrode line 67 overlaps the first connection portion 231. A sub pixel electrode line 672 connected to the second connection portion 671 and overlapping the sub common electrode line 232 is formed parallel to the first connection portion 231. Additionally, a plurality of pixel electrodes 68 are extended from the sub pixel electrode line 67 perpendicular to the sub pixel electrode line 672.

Also, redundant repair line 92 overlaps the gate line 22 and the common electrode line 23 neighboring the gate line 22, and is formed of the same layer as the data line 62 or the redundant data line 90.

In the wire structure according to the fifth embodiment as shown in FIG. 14, if the gate line 22 is severed in portion A, the gate line 22, the common electrode line 23, and the S1, S2, S3, and S4 portions overlapping the redundant repair lines 92 located at both sides of the portion A are shorted using a laser. Next, the left and the right O1 and O3 portions of the common electrode line 23 neighboring the S2 and S3 portions got open, respectively. Also, the O2 portion of the first and the second connection portions 231 and 671 is disconnected to prevent a scanning signal from being transmitted to the common electrodes 21.

In this way, because the plurality of the common electrodes 21 and the pixel electrode 68 are disconnected at once by disconnecting the first and the second connection portions 231 and 671 in the method according to the fifth embodiment, the number of disconnects may be reduced to one fourth or to one fifth.

Figure 15:
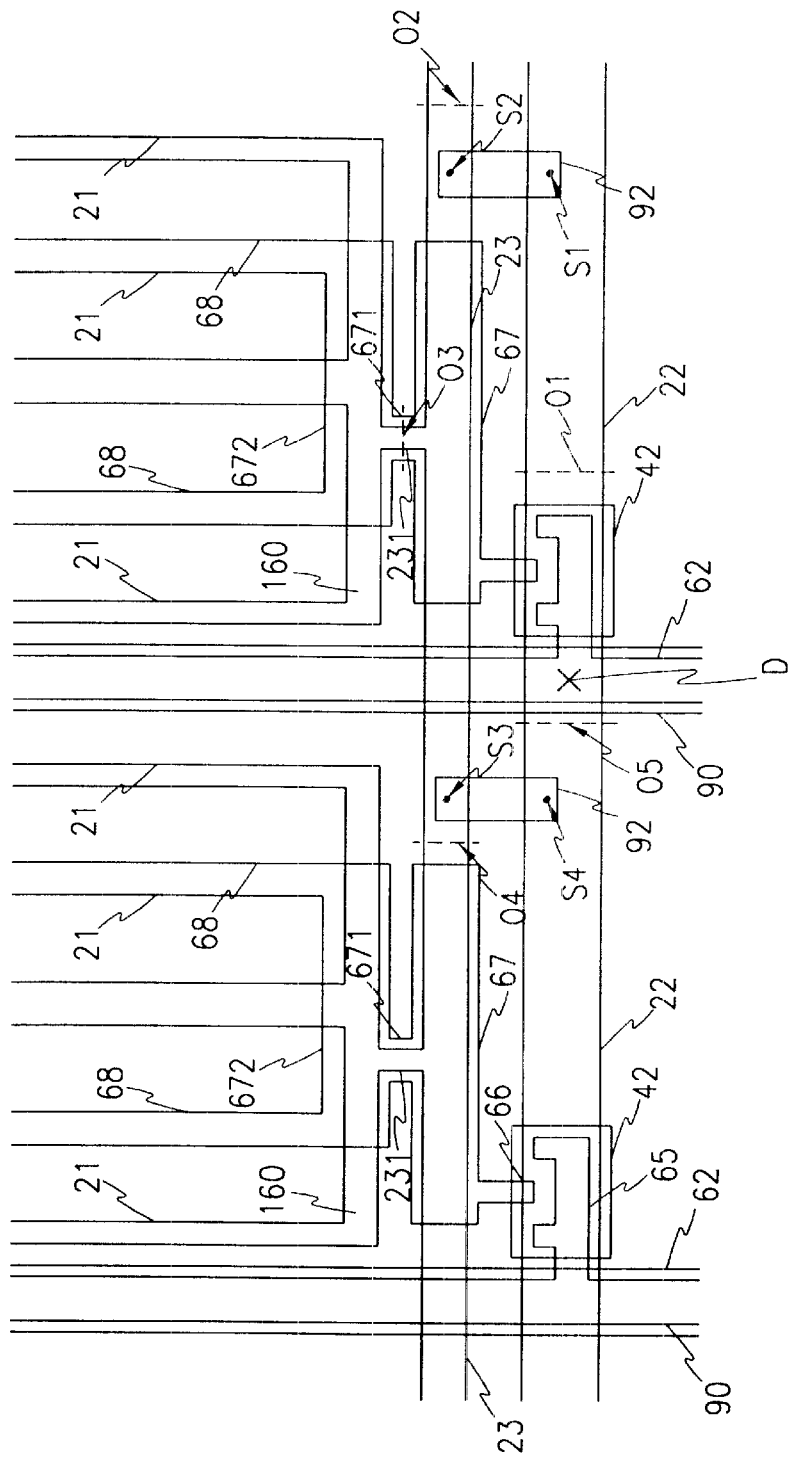
FIG. 15 is a layout view showing a method for repairing a short between a data line and a gate line in a thin film transistor array panel for a liquid crystal display according to the fifth embodiment of the present invention.

FIG. 15 is a layout view showing a method for repairing a short between a data line and a gate line in a thin film transistor array panel for a liquid crystal display according to the fifth embodiment of the present invention.

As shown in FIG. 15, if the portion overlapping the gate line 22 and the data wire 62, 65, and 92 is shorted at portion D, then the O1 and O5 portions of the gate line 22 on both sides of the portion D are disconnected to prevent an image signal from being transmitted to the gate line 22 through the short portion D, as in the above embodiment. The S1, S2, S3, and S4 portions overlapping the redundant repair lines 92 located at both sides of the portion D, along with the gate line 22 and the common electrode line 23, are shorted by using a laser. Next, the O4 and O2 portions of the common electrode line 23, which are respectively located at left and right sides of the left and right redundant repair lines 92 in FIG. 15 are disconnected. Also, the O3 portion of the first and the second connection portions 231 and 671 is disconnected.

Just as in the method of repairing an open gate line, because the plurality of the common electrodes 21 and the pixel electrode 68 are disconnected at once by disconnecting the first and the second connection portions 231 and 671 in the method according to the fifth embodiment, the number of disconnects may be reduced to about a quarter or to one fifth, improving the productivity in defect repair.

In the present invention, by forming a redundant repair line overlapping the gate line, the storage electrode line, or the common electrode line, open/short defects of the gate line and the data line may be easily repaired. Additionally, by forming a storage wire connection portion connecting the storage electrode lines of neighboring pixel, the distortions of signals transmitted to the storage electrode line may also be minimized.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A thin film transistor array panel for a liquid crystal display, comprising:
   a gate wire including gate lines formed in a horizontal direction;
   a storage wire including storage electrode lines formed in the same direction as the gate lines, storage electrodes connected to the storage electrode lines, and at least one storage electrode connection portion connecting the storage electrodes of a neighboring pixel;
   a data wire including data lines formed in a vertical direction, wherein said data wire intersects and is insulated from said storage wire and said gate wire;
   a pixel electrode formed in a pixel defined by an intersection of the gate line and the data line, wherein said pixel electrode forms a storage capacitor by overlapping the storage wire, and receives image signals through the data line; and
   a redundant repair line that overlaps and is insulated from the storage wire at one end and overlaps the storage wire or the gate wire of a neighboring pixel at the other end.

2. The thin film transistor array panel of claim 1, further comprising a storage wire connection portion connecting storage wires of neighboring pixels.

3. The thin film transistor array panel of claim 2, wherein the storage wire connection portion is formed of the same layer as said pixel electrode.

4. The thin film transistor array panel of claim 1, wherein said redundant repair line is formed of the same layer as said data wire.

5. The thin film transistor array panels of claim 1, wherein said storage wires are formed of the same layer as said gate wire.

6. A thin film transistor array panel for a liquid crystal display, comprising:
   an insulating substrate;
   a gate wire formed on the insulating substrate, wherein said gate wire includes a gate line formed in a horizontal direction and transmitting a scanning signal, and a gate electrode connected to the gate line;
   a storage wire formed on the insulating substrate, wherein said storage wire includes a storage electrode line formed in a direction parallel to the gate line, a storage electrode connected to the storage electrode line, and at least one storage electrode connection portion connecting storage electrodes of neighboring pixels;
   a gate insulating layer covering said gate wire and said storage wire;
   a semiconductor layer formed on the gate insulating layer and made of semiconductor material;
   a data wire including a data line formed in a vertical direction, a source electrode connected to the data line and extended on the semiconductor layer, and a drain electrode extended on the semiconductor layer and separated from the source electrode with respect to the gate electrode, wherein the data line defines a pixel by intersecting the gate line;
   a redundant repair line on said gate insulating layer that is insulated from the storage wire at one end and that overlaps said storage wire or said gate wire of a neighboring pixel at the other end;
   a passivation layer covering said data wire and said redundant repair line; and
   a pixel electrode electrically connected to the drain electrode through the first contact hole.

7. The thin film transistor array panel of claim 6, wherein data wire is formed on said gate insulating layer.

8. The thin film transistor array panel of claim 7, wherein said pixel electrode is formed on said passivation layer and connected to the drain electrode through a contact hole of said passivation layer.

9. The thin film transistor array panel of claim 6, further comprising a storage wire connection portion formed on said passivation layer,
   wherein the storage wire connection portion connects the storage wires of neighboring pixels through a contact hole of the passivation layer and the gate insulating layer.

10. A method for repairing a severed gate wire of a thin film transistor array panel for a liquid crystal display, wherein the thin film transistor array panel for a liquid crystal display has a gate wire including a gate line formed in a particular direction, a storage wire including a storage electrode line formed in the same direction as the gate line, a storage electrode connected to the storage electrode line and at least one of storage electrode connection portions connecting storage electrodes of neighboring pixels, a data wire including a data line formed in a direction approximately perpendicular to the gate line and intersecting while insulated from the gate wire and the storage wire, a pixel electrode formed in a pixel defined by the intersection of the gate line and the data line, forming a storage capacitor by overlapping the storage wire, and receiving image signals through the data line, and a redundant repair line that overlaps and is insulated from the storage wire at one end and overlaps the storage wire or the gate wire of a neighboring pixel at the other end, comprising the steps of:
   shorting the severed gate line and the storage wire and the redundant repair lines overlapping the severed gate line and the storage wire.

11. A method for repairing a severed data wire of a thin film transistor array panel for a liquid crystal display, wherein the thin film transistor array panel for a liquid crystal display has a gate wire including a gate line formed in a particular direction, a storage wire including a storage electrode line formed in the same direction as the gate line, a storage electrode connected to the storage electrode line and at least one of storage electrode connection portions connecting storage electrodes of neighboring pixels, a data wire including a data line formed in a direction approximately perpendicular to the gate lines and intersecting while insulated from the gate wire and the storage wire, a pixel electrode formed in a pixel defined by the intersection of the gate line and the data line, forming a storage capacitor by overlapping the storage wire, and receiving image signals through the data line, and a redundant repair line that overlaps and is insulated from the storage wire at one end and overlaps the storage wire or the gate wire of a neighboring pixel at the other end, comprising the steps of:
   shorting the severed data line and the storage wire overlapping the severed data line.

12. A method for repairing a data wire of a thin film transistor array panel for a liquid crystal display when a source electrode is severed from the data line, wherein the thin film transistor array panel for a liquid crystal display having a gate wire including a gate line formed in a particular direction, a storage wire including a storage electrode line formed in the same direction as the gate line, a storage electrode connected to the storage electrode line and at least one of storage electrode connection portions connecting storage electrodes of neighboring pixels, a data wire including a data line formed in a direction approximately perpendicular to the gate line and intersecting while insulated from the gate wire and the storage wire, a pixel electrode formed in a pixel defined by intersection of the gate line and the data line, forming a storage capacitor by overlapping the storage wire, and receiving image signals through the data line, and a redundant repair line that overlaps and is insulated from the storage wire at one end, and overlaps the storage wire or the gate wire of a neighboring pixel at the other end, comprising, the steps of:

shorting the storage wire and the redundant repair line neighboring the severed source electrode; and shorting the shorted storage wire and the severed data line.

13. A method for repairing wires of a thin film transistor array panel for a liquid crystal display when a source electrode is severed from a data line, wherein the thin film transistor array panel for a liquid crystal display has a gate wire including a gate line formed in a particular direction, a storage wire including a storage electrode line formed in the same direction as the gate line, a storage electrode connected to the storage electrode line and at least one of storage electrode connection portions connecting storage electrodes of neighboring pixels, a data wire including a data line formed in a direction approximately perpendicular to and intersecting while insulated from the gate wire and the storage wire, a pixel electrode formed in a pixel defined by intersection of the gate line and the data line, forming a storage capacitor by overlapping the storage wire, and receiving image signals through the data line, a redundant repair line that overlaps and is insulated from the storage wire at one end and overlaps a storage wire or a gate wire of a neighboring pixel at the other end, and a storage wire connection portion connecting storage wires of a neighboring pixel column, comprising the steps of:

shorting the storage wire neighboring the severed source electrode and the severed data line.

14. A thin film transistor array panel for a liquid crystal display, comprising:

an insulating substrate;

a gate line formed on said insulating substrate in a horizonal direction and including a gate electrode;

a common electrode line formed between two neighboring gate lines;

a common electrode electrically connected to said common electrode line and formed in a vertical direction;

a data wire formed in a vertical direction and intersecting said gate line;

a semiconductor layer on and insulated from said gate line;

a source electrode connected to said data wire and extended on said semiconductor layer;

a drain electrode extended on said semiconductor layer and separated from source electrode;

a pixel electrode electrically connected to said drain electrode and formed in parallel and alternately with the common electrodes; and a redundant repair line simultaneously overlapping said common electrode line and said gate line.

15. The thin film transistor array panel of claim 14, wherein said common electrode line is formed in duplicate, and said redundant repair line overlaps one of the duplicate common electrode lines.

16. The thin film transistor array panel of claim 14, wherein said common electrode line has duplicate wires including a first wire and a second wire, and said redundant repair line simultaneously overlaps the first wire and the second wire located at both sides of said gate line.

17. The thin film transistor array panel of claim 14, further comprising a first connection portion extended to said common electrode line, a sub common electrode line connecting said common electrode as one body and connected to the first connection portion, a pixel electrode line extended from the drain electrode and overlapping said common electrode line, a second connection portion extended from the pixel electrode line and overlapping the first connection portion, and a sub pixel electrode line connecting said pixel electrode as one body and overlapping the sub common electrode line.

18. The thin film transistor array panel of claim 14, wherein said data wire includes a redundant data line, and a data line connected through a contact hole of an interlayer insulating layer formed between the data line and the redundant data line.

19. The thin film transistor array panel of claim 18, wherein the redundant repair line is formed of the same layer as the redundant data line.

20. The thin film transistor array panel of claim 18, wherein the redundant repair line is formed of the same layer as the data line.

\* \* \* \* \*